(12) United States Patent
Sakata et al.

(10) Patent No.: US 8,207,619 B2
(45) Date of Patent: Jun. 26, 2012

(54) SEMICONDUCTOR DEVICE AND METHOD OF MANUFACTURING THE SAME

(75) Inventors: Kenji Sakata, Kanagawa (JP); Tsuyoshi Kida, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 133 days.

(21) Appl. No.: 12/659,766

(22) Filed: Mar. 19, 2010

(65) Prior Publication Data

US 2010/0244228 A1    Sep. 30, 2010

(30) Foreign Application Priority Data

Mar. 27, 2009 (JP) .................... 2009-080212

(51) Int. Cl.
*H01L 23/29* (2006.01)
(52) U.S. Cl. ............... 257/789; 257/795; 257/E21.503; 257/E21.511
(58) Field of Classification Search .......... 257/788, 257/789, 791–793, 795, E23.116, E23.119, 257/E23.121, E23.123, E23.135, E23.136, 257/778
See application file for complete search history.

(56) References Cited

U.S. PATENT DOCUMENTS

| 6,632,690 | B2 * | 10/2003 | Master et al. | 438/15 |
| 7,656,046 | B2 * | 2/2010 | Kurita et al. | 257/787 |
| 2008/0157328 | A1 | 7/2008 | Kawata | |
| 2008/0237892 | A1 * | 10/2008 | Saeki | 257/778 |

FOREIGN PATENT DOCUMENTS

JP    11-17070    1/1999
JP    2008-166373    7/2008

* cited by examiner

*Primary Examiner* — Jasmine Clark
(74) *Attorney, Agent, or Firm* — McGinn IP Law Group, PLLC

(57) ABSTRACT

The extent of a bow of a semiconductor device is suppressed in a case where the fillet width of an underfill resin is asymmetrical. The center position 12 of a chip 1 is caused to deviate from the center position 13 of a wiring substrate 2 in a direction (the direction of the arrow B) reverse to the deviation direction (the direction of the arrow A) of the center position 11 of an underfill resin 4 from the center position 12 of the chip 1. The center position 14 of a resin for encapsulation 6 is caused to deviate from the center position 13 of the wiring substrate 2 in the same direction (the direction of the arrow A) as the deviation direction (the direction of the arrow A) of the center position 11 of the underfill resin 4 from the center position 12 of the chip 1.

14 Claims, 29 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device.

2. Description of the Related Art

As a small-area, thin semiconductor package (hereinafter simply called "a package") that permits high-density packaging, there is available a package in which the flip-chip mounting method is adopted for an electrical connection between a semiconductor chip (hereinafter simply called "a chip") and a wiring substrate (hereinafter simply called "a board"). In recent years, demand for this type of package has been increasing.

FIGS. 25 and 26 are diagrams showing a general semiconductor device in which the flip-chip mounting method is adopted. FIG. 25 is a sectional view and FIG. 26 is a plan view.

As shown in FIG. 25, the flip-chip mounting method is such that an electrode pad (not shown) formed on a surface (circuit surface) of a chip 101 and an electrode pad (not shown) formed on an interconnect (not shown) of a board 102 are bonded together via bumps 103 formed from solder, gold, copper and the like, whereby the chip 101 and the board 102 are connected together.

Because the bumps 103 have a certain height (on the order of 10 μm to 150 μm), usually a gap is generated between the mounted chip 101 and the board 102. An underfill resin 104 is generally filled in this gap. The filling of the underfill resin 104 is performed to protect a bond part bonded via the bumps 103 and a surface of the chip 101 and to prevent the bumps 103 from melting due to high-temperature treatment performed during the mounting of the package and shorting between the bumps 103.

The process of filling the underfill resin 104 into a gap between the chip 101 and the board 102 is often performed after the connection of the chip 101 to the board 102. This process is generally performed by causing the underfill resin 104 to fall in drops from near the chip 101 by use of a needle or the like in such a manner that the underfill resin 104 is caused to penetrate (injected) to between the chip 101 and the board 102 by the capillary phenomenon.

In almost all cases, the filling of the underfill resin 104 is performed either by injection from one point near the chip 101 or by injection while the needle is being moved along any one selected from the four sides of the chip 101 (the four sides forming a planar shaped outer circumference of the chip 101).

A portion composed of the chip 101, the board 102 and the bumps 103 is called a flip-chip mounted body. In the flip-chip mounted body, a bow has already occurred in the flip-chip mounting step, which is the step just before the step of injecting the underfill resin 104. If the board 102 is positioned below and the chip 101 is positioned above, this bow is an upward convex bow which is laterally symmetrical with reference to the center position 107 of the chip 101. For example, when the bumps 103 are formed from a lead-free solder, this bow occurs due to a difference in the coefficient of thermal expansion between the board 102 and the chip 101, which is generated during cooling to room temperature after the connection of the chip 101 to the board 102 by melting the bumps 103 at temperatures of not less than 250° C. The coefficient of thermal expansion of the board 102 is five to ten times the coefficient of thermal expansion of the chip 101. Incidentally, when the bumps 103 are formed from a lead-free solder, the effect of the underfill resin 104 on the bow is a limited one and, therefore, it may be thought that the greater part of the bow of the flip-chip mounted body is inherited from a bow which occurred in the flip-chip mounting step, which is a preceding step.

When a bow is large for such reasons as the thinness of the board 102, a flip-chip mounted body may sometimes be used as a package by the resin encapsulation of the flip-chip mounted body after the setting of the underfill resin 104 in order to correct the bow in the flip-chip mounted body. That is, in order to correct a convex bow existing after the setting of the underfill resin 104, for example, as shown in FIGS. 25 and 26, the extent of a bow on the whole package is lessened by the encapsulation with a resin for encapsulation 106 having a large contraction stress in such a manner as to cover an upper part of the flip-chip mounted body.

In a general package, the structure of the package is such that, as shown in FIGS. 25 and 26, the center position 108 of the board 102 (which is also the center of the package and the center of the flip-chip mounted body), the center position 107 of the chip 101, and the center position 109 of the resin for encapsulation 106 coincide with each other.

Incidentally, FIG. 26 shows the stage before the singulation of each package. The board 102 and the resin for encapsulation 106 are cut along dicing lines 115 shown in FIG. 26, whereby each package is separated and it is possible to obtain the semiconductor device shown in FIG. 25.

As with the semiconductor device shown in FIGS. 25 and 26, a semiconductor device in which the flip-chip mounting method is adopted is disclosed in Japanese Patent Laid-Open No. 2008-166373, for example.

Japanese Patent Laid-Open No. 11-017070 discloses a structure which is such that a chip is mounted on a first board by the flip-chip mounting method and is filled with an underfill resin and on this chip there are disposed a resin and a second board symmetrically with reference to the center of the chip, whereby thermal stress, particularly, the setting and shrinkage of the resins are kept in balance above and below the chip and a bow in the whole structure is compensated for.

A protruding portion of the underfill resin 104 which is formed in the circumference of the chip 101 is called a fillet 105. The shape of the fillet 105 depends on a method of injecting the underfill resin 104. In general, the fillet 105 is relatively large in a portion where the injection of the underfill resin 104 is performed in the circumference of one chip 101 and is relatively small in other portions. For this reason, generally, the position of the whole (filler outer circumference) of the underfill resin 104 is asymmetrical with reference to the center position 107 of the chip 101.

Specific examples of the shape of the fillet 105 are described with the aid of FIGS. 27A and 27B and FIGS. 28A and 28B. FIGS. 27A and 27B show the shape of a fillet 105 obtained when the underfill resin 104 was injected from one point, and FIGS. 28A and 28B show the shape of a fillet 105 obtained when the injection of the underfill resin 104 was performed while a needle was being moved along one side of the chip 101. FIGS. 27A and 28A are sectional views and FIGS. 27B and 28B are plan views.

As shown in FIGS. 27A and 27B, when the underfill resin 104 is injected, with the position of the needle for injecting the underfill resin 104 fixed at one point (the needle position 111 of FIG. 27B, a portion of the fillet 105 whose center is the needle position 111 becomes a large-sized portion 105*a* whose size is relatively large. In the fillet 105, a portion other than the needle position 111 and the surrounding portion thereof becomes a small-sized portion 105*b* whose size is smaller than the large-sized portion 105*a*. As shown in FIGS.

28A and 28B, when the underfill resin 104 is injected while the needle position 111 is being moved along one side 112 of the chip 101, a portion of the fillet 105 along the side 112 becomes a large-sized portion 105a and the other portion becomes a small-sized portion 105b.

When the fillet 105 of the underfill resin 104 is formed asymmetrical with reference to the center position 107 of the chip 101 in this manner, also the distribution of the amount of the resin for encapsulation 106 in a package becomes asymmetrical according to the shape of the fillet 105. As a result of this, also the bow correcting effect of the resin for encapsulation 106 becomes asymmetrical. That is, in a portion where the fillet 105 is large (the large-sized portion 105a), a sufficient bow correcting effect cannot be obtained because the amount of the resin for encapsulation 106 becomes relatively small. Contrastingly, in a portion where the fillet 105 is small (the small-sized portion 105b), the bow correcting effect may sometimes become excessive because the amount of the resin for encapsulation 106 becomes relatively large.

In a general package, the center position 108 of the board 102, the center position 107 of the chip 101, and the center position 109 of the resin for encapsulation coincide with each other. In this case, when the fillet 105 of the underfill resin 104 is formed asymmetrical with reference to the center position 107 of the chip 101, the balance of the bow correcting effect after resin encapsulation becomes lost when the package is viewed as a whole. For this reason, as a result of this, for example, as shown in FIG. 29A, a semiconductor device (a package) may sometimes have an asymmetrical bow shape. Incidentally, FIG. 29A is a diagram showing, in an exaggerated manner, the bow shape of a package which obtained room temperature after resin encapsulation.

The contractive force of the resin for encapsulation 106 has a predominant effect on a bow in a flip-chip mounted body. For this reason, the bow shape of a package becomes asymmetrical mainly due to the extent of the bow correcting effect of the resin for encapsulation 106 in each portion of the package.

However, when the underfill resin 104 is a thermosetting resin, the setting of this resin proceeds at temperatures higher than room temperature (for example, on the order of 80° C. to 200° C.). For this reason, when the temperature of the underfill resin 104 returns to room temperature after setting, a thermal stress is generated between the underfill resin 104 and the board 102 due to differences in the coefficient of thermal expansion and the modulus of elasticity and as a result of this, the condition of a bow of a flip-chip mounted body which has originally warped due to a thermal stress during flip-chip mounting changes a little. This change is also affected, though slightly, by the shape of the fillet 105 formed in the circumference of the chip 101. If the board 102 is positioned below and the chip 101 is positioned above, before the setting of the underfill resin 104, the bow is symmetrical with reference to the center of the chip 101 and becomes convex upward. However, in a case where the center position 107 of the chip 101 and the center position 108 of the board 102 coincide with each other, when the underfill resin 104 sets, with the shape of the fillet 105, particularly, the size of the fillet 105 differing according to a portion in the circumference of the chip 101, a bow of the board 102 after setting becomes asymmetrical in the strict sense with reference to the center of the flip-chip mounted body (the center position 108 of the board 102). That is, although the effect of the shape of the fillet 105 of the underfill resin 104 on the bow of a flip-chip mounted body is a limited one, strictly speaking, also due to a thermal stress generated by the underfill resin 104, the bow of the flip-chip mounted body, hence the bow of the whole semiconductor device becomes asymmetrical. Furthermore, because the bow of the flip-chip mounted body, hence the bow of the whole semiconductor device becomes asymmetrical like this, the amount of bow of the flip-chip mounted body, hence the amount of bow on one side of the semiconductor device also increases.

A description will be given here of specific examples of values of physical properties for each of the resin for encapsulation 106, the underfill resin 104, the board 102, and the chip 101. For the resin for encapsulation 106, for example, Tg (the glass transition temperature) is 120 to 130° C., α1 (the coefficient of linear expansion at less than Tg) is 30 to 40 ppm/° C., and α2 (the coefficient of linear expansion at not less than Tg) is 80 to 120 ppm/° C.). For the underfill resin 104, for example, Tg is 135 to 145° C., α1 is 20 to 30 ppm/° C., and α2 is 80 to 100 ppm/° C. For the board 102, for example, Tg is 160 to 190° C., α1 is 15 to 30 ppm/° C., and α2 is 10 to 35 ppm/° C. For the chip 101, for example, α (the coefficient of linear expansion) is 3 to 5 ppm/° C. In general, when the coefficient of thermal expansion (concretely, for example, the coefficient of linear expansion) of the resin for encapsulation 106 is larger than the coefficient of thermal expansion of the underfill resin 104, the package bow reducing effect (the bow correcting effect) is dependent on the resin for encapsulation 106 (the contractive force of the resin for encapsulation 106 becomes predominant over the bow shape of the package). Also when Tg of the resin for encapsulation 106 is lower than Tg of the underfill resin 104, the package bow reducing effect (the bow correcting effect) is dependent on the resin for encapsulation 106 (the contractive force of the resin for encapsulation-106 becomes predominant over the bow shape of the package). That is, the lower Tg of the resin for encapsulation 106, the wider the temperature region (temperature range) in which the coefficient of thermal expansion (concretely, for example, the coefficient of linear expansion) of the resin for encapsulation 106 becomes larger than the coefficient of thermal expansion of the underfill resin 104, and in this sense, the lower Tg of the resin for encapsulation 106, the more the contractive force of the resin for encapsulation 106 will be predominant over the bow shape of the package.

Also from these values of physical properties, it is apparent that as shown in FIGS. 25 and 26, when the center positions 107, 108 and 109 of the chip 101, the board 102 and the resin for encapsulation 106, respectively, coincide with each other, a bow at room temperature does not become symmetrical (FIG. 29A), and that besides a bow of a package can exhibit an asymmetrical behavior also to a temperature response (a response of a bow to a temperature change).

When a semiconductor device is mounted on a wiring substrate and the temperature response of a bow at the temperature at which reflow is performed is asymmetrical, this can exert an adverse effect on the mountability of the semiconductor device. That is, when a semiconductor device is mounted on a wiring substrate (a motherboard, not shown), which is an end product, by melting BGA balls 110 (FIG. 25) of the semiconductor device (reflow), the package obtains temperatures (for example, 230° C. to 260° C.) higher than the setting temperatures of the underfill resin 104 and the resin for encapsulation 106. Therefore, the thermal stress balance in the interior of the package becomes lost and the bow of the package exhibits an asymmetrical behavior.

FIG. 29B shows, in an exaggerated manner, the bow behavior of a package during the reflow of mounting (solder melting temperature: for example, 230° C. to 260° C., as described above). Incidentally, as shown in FIGS. 29A and 29B, the direction of the bows of a package is inverted at room temperature (FIG. 29A) and solder melting temperatures (FIG. 29B). This is due to a difference in the coefficient of linear expansion between the board 102 and the chip 101. The bow of the package becomes almost zero at the temperature at which the chip 101 is flip-chip mounted on the board 102. However, because the board 102 has a larger coefficient of linear expansion than the chip 101, the amount of contraction of the board 102 becomes larger than that of the chip 101 at temperatures of not more than the flip-chip mounting temperature. Therefore, an upward convex bow occurs in the whole semiconductor device. Contrastingly, at temperatures higher than the flip-chip mounting temperature, i.e., during the reflow of mounting at temperatures higher than solder melting points, the amount of expansion of the board 102 becomes larger than that of the chip 101 and, therefore, a downward convex bow occurs in the whole semiconductor device.

When a package has an asymmetrical bow shape at room temperature, this has an effect on the transferability of a flux during mounting. Also, when an asymmetrical bow occurs during the reflow in mounting on a wiring substrate, this has an effect on the bondability of the BGA balls 110 to the wiring substrate or the connection reliability after mounting. As described above, asymmetry of the bow characteristics of a package results in a decrease in the margin of mountability, a decrease in mounting yield, and a decrease in mounting reliability. Such adverse effects of asymmetry of bows have become manifest particularly in packages in which recent thin boards of less than 400 μm are used.

As described above, it has been difficult to suppress the extent of bows of semiconductor devices when the center of an underfill resin deviates from the center of a chip due to the asymmetry of the fillet width of the underfill resin.

SUMMARY

The present invention provides a semiconductor device including a wiring substrate, a semiconductor chip mounted on the wiring substrate in such a manner that one surface thereof is opposed to one surface of the wiring substrate, and a first resin which is filled in a gap between the surface of the wiring substrate and the surface of the semiconductor chip and part of which protrudes from the gap. The center position of the first resin and the center position of the semiconductor chip deviate from each other in a direction along the surface of the wiring substrate. The center position of the semiconductor chip deviates from the center position of the wiring substrate in a direction reverse to the deviation direction of the center position of the first resin from the center position of the semiconductor chip.

According to this semiconductor device, in a case where the center position of the first resin and the center position of the semiconductor chip deviate from each other in a direction along the surface of the wiring substrate, the center position of the semiconductor chip is caused to deviate from the center position of the wiring substrate in a direction reverse to the deviation direction of the first resin from the center position of the semiconductor chip, whereby it is possible to improve the symmetrical characteristic of a bow in the whole semiconductor device. As a result, it is possible to suppress the extent of a bow of the semiconductor device. That is, if a bow is asymmetrical, the bow warps greatly on one side, whereas making a bow symmetrical enables the amount of bow on the side where the bow is large to be reduced. Hence, it is possible to improve the mountability and mounting reliability of the semiconductor device.

The present invention provides also a semiconductor device including, a wiring substrate, a semiconductor chip mounted on the wiring substrate in such a manner that one surface thereof is opposed to one surface of the wiring substrate, a first resin which is filled in a gap between the surface of the wiring substrate and the surface of the semiconductor chip and part of which protrudes from the gap, and a second resin formed on the surface of the wiring substrate in such a manner as to cover the semiconductor chip and a portion protruding from the gap in the first resin. In this semiconductor device, the center position of the first resin and the center position of the semiconductor chip deviate from each other in a direction along the surface of the wiring substrate. In this semiconductor device, the center position of the second resin deviates from the center position of the wiring substrate in the same direction as the deviation direction of the center position of the first resin from the center position of the semiconductor chip.

According to this semiconductor device, in a case where the center position of the first resin and the center position of the semiconductor chip deviate from each other in a direction along the surface of the wiring substrate, the center position of the second resin is caused to deviate from the center position of the wiring substrate in the same direction as the deviation direction of the first resin from the center position of the semiconductor chip, whereby it is possible to improve the symmetrical characteristic of a bow in the whole semiconductor device. As a result, it is possible to suppress the extent of a bow of the semiconductor device. That is, if a bow is asymmetrical, the bow warps greatly on one side, whereas making a bow symmetrical enables the amount of bow on the side where the bow is large to be reduced. Hence, it is possible to improve the mountability and mounting reliability of the semiconductor device.

The present invention provides also a method of manufacturing a semiconductor device including a first step which involves mounting a semiconductor chip on a wiring substrate in such a manner that one surface of the semiconductor chip is opposed to one surface of the wiring substrate, and a second step which involves filling a first resin in a gap between the surface of the wiring substrate and the surface of the semiconductor chip in such a manner that part of the first resin protrudes from the gap. In the second step, the first resin is injected into the gap by use of a first resin injection nozzle while the first resin injection nozzle is being moved along any one of sides of the semiconductor chip or along two sides of the semiconductor chip which are adjacent to each other. In the first step, the center position of the semiconductor chip is caused to deviate from the center position of the wiring substrate in the direction in which one or two sides of the semiconductor chip where, in the second step, injection of the first resin is performed by use of the first resin injection nozzle, moves away from an end of the semiconductor device positioned nearest to the sides in question.

The present invention provides also a method of manufacturing a semiconductor device including a first step which involves mounting a semiconductor chip on a wiring substrate in such a manner that one surface of the semiconductor chip is opposed to one surface of the wiring substrate, a second step which involves filling a first resin in a gap between the surface of the wiring substrate and the surface of the semiconductor chip in such a manner that part of the first resin protrudes from the gap, and a third step which involves forming a second resin on the surface of the wiring substrate in such a manner as to cover the semiconductor chip and a portion protruding from the gap in the first resin. In the second step, the first resin is injected into the gap by use of a first resin injection nozzle while the first resin injection nozzle is being moved along any one of sides of the semiconductor chip or along two sides of the semiconductor chip which are adjacent to each other. In the third step, the center position of the second resin is caused to deviate from the center position of the wiring substrate in a direction of one side or directions of two sides of the semiconductor chip where, in the second step, injection of the first resin is performed by use of the first resin injection nozzle.

According to the present invention, it is possible to suppress the extent of a bow of a semiconductor device when the center position of the first resin and the center position of the semiconductor chip deviate from each other in a direction along one surface of the wiring substrate.

DETAILED DESCRIPTION OF THE PREFERRED EMBODIMENTS

Figure 1:
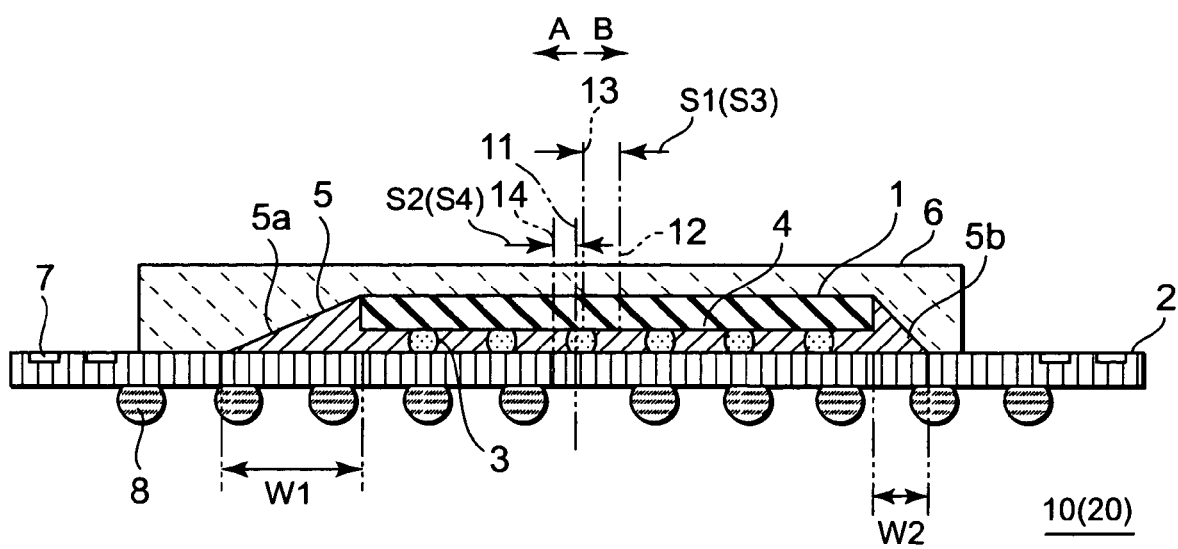
FIG. 1 is a sectional view common to semiconductor devices of the first and second embodiments.

Hereinafter, embodiments of the present invention will be described with the aid of the accompanying drawings. In all of the drawings, similar reference numerals refer to similar component elements and descriptions of such component elements will be appropriately omitted.

First Embodiment

Figure 2:
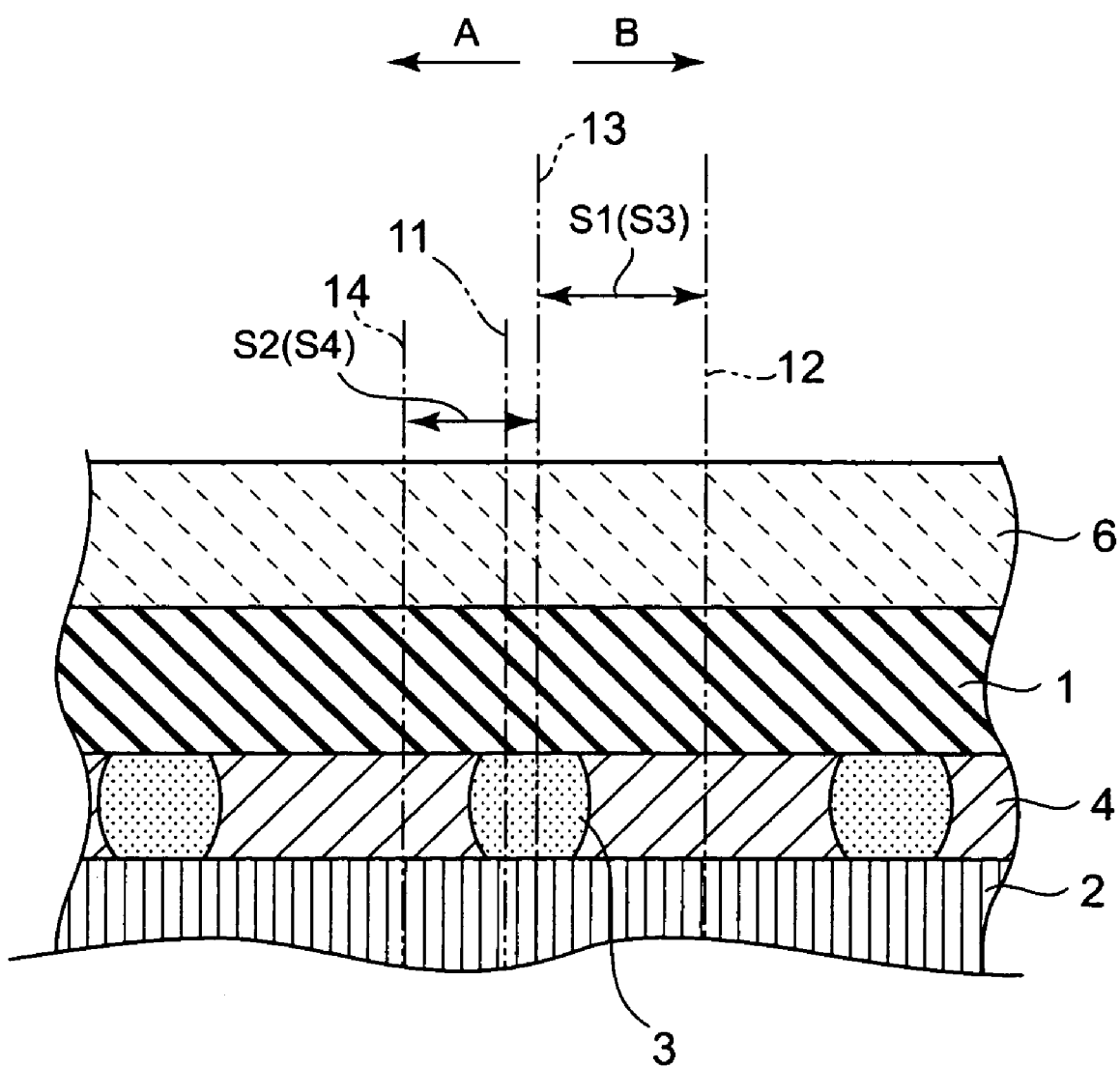
FIG. 2 is an enlarged view of an essential portion of FIG. 1.
Figure 3:
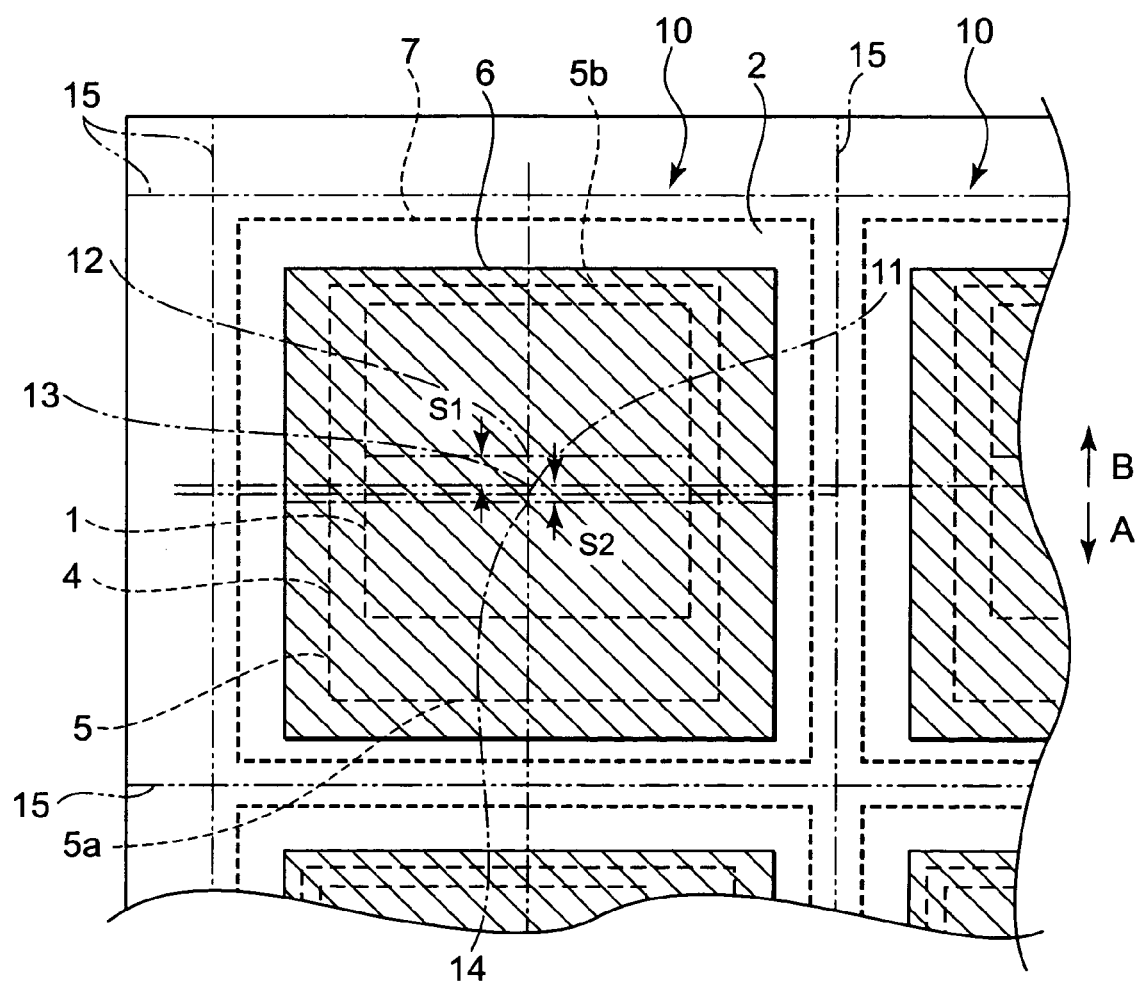
FIG. 3 is a plan view of the semiconductor device of the first embodiment.
Figure 4:
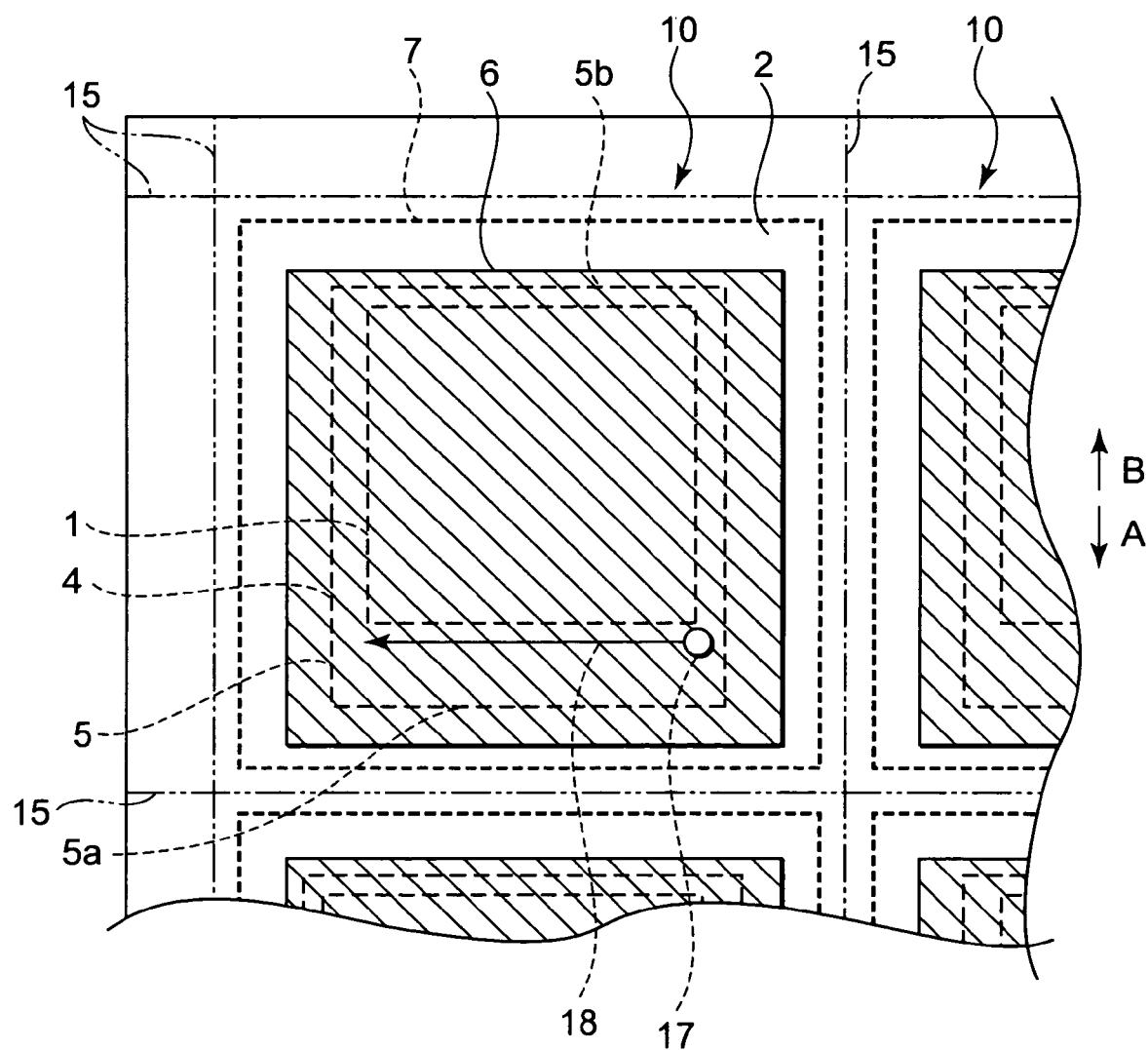
FIG. 4 is a plan view showing the action of an underfill resin injection nozzle during the formation of an underfill resin in the semiconductor device of the first embodiment.
Figure 5:
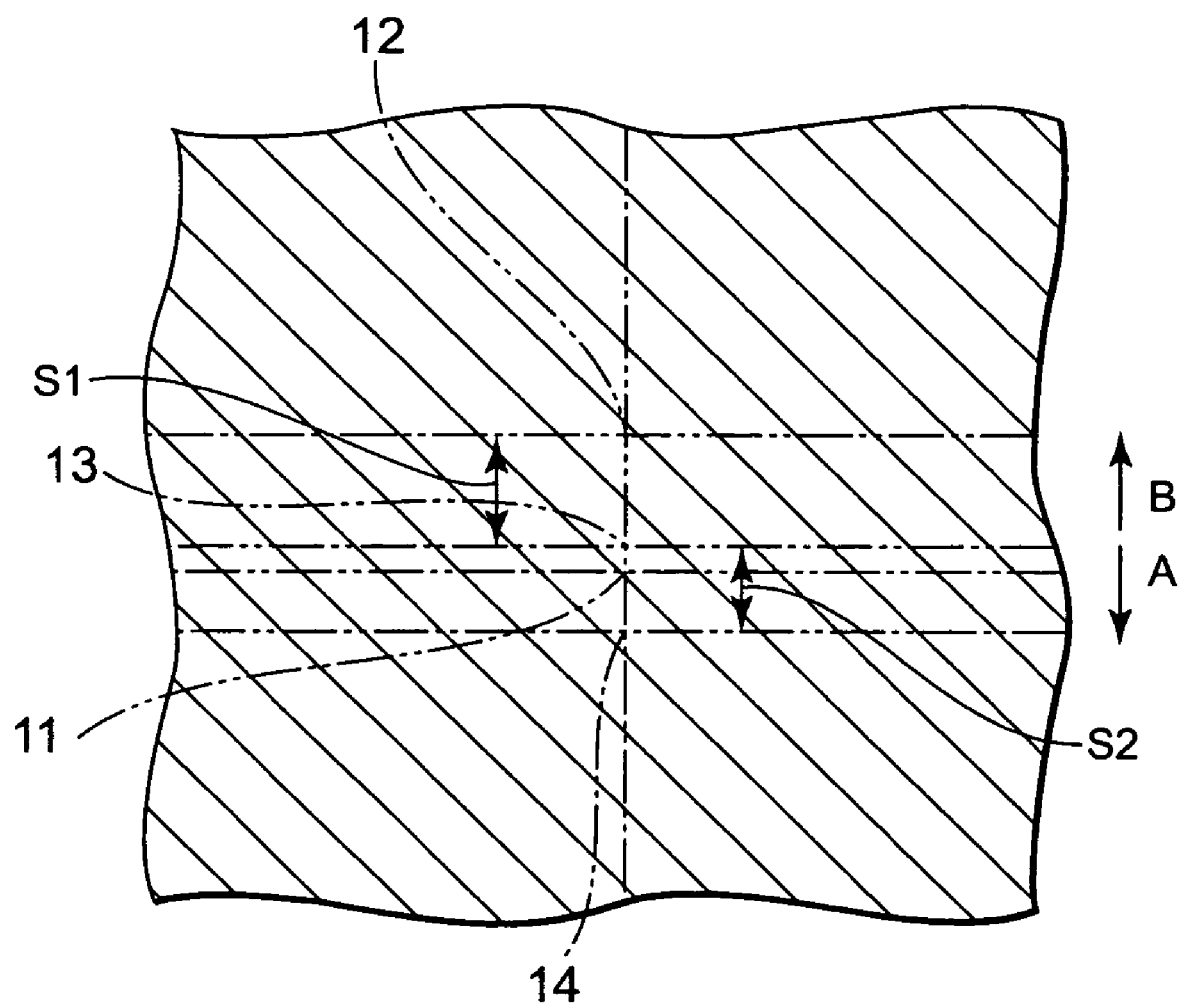
FIG. 5 is an enlarged view of an essential portion of FIG. 3.

FIG. 1 is a sectional view of a semiconductor device 10 of the first embodiment. FIG. 2 is an enlarged view of an essential portion of FIG. 1. FIGS. 3 and 4 are plan views of the semiconductor device 10 of the first embodiment. FIG. 4 shows the action (a movement line 18) of an underfill resin injection nozzle (not shown) during the formation of an underfill resin 4. FIG. 5 is an enlarged view of an essential portion of FIG. 3. Incidentally, FIGS. 3 and 4 show the condition before the singulation of each semiconductor device (package) 10. FIGS. 6A to 6E are plan views showing the flow of a series of steps to explain the manufacturing method of the semiconductor device of the first embodiment.

The semiconductor device 10 of the present embodiment includes a wiring substrate 2, a semiconductor chip 1 mounted on the wiring substrate 2 in such a manner that one surface thereof is opposed to one surface of the wiring substrate 2, and a first resin (an underfill resin 4) which is filled in a gap between the surface of the wiring substrate 2 and the surface of the semiconductor chip 1 and part of which protrudes from the gap. The center position 11 of the first resin (the underfill resin 4) and the center position 12 of the semiconductor chip 1 deviate from each other in a direction along the surface of the wiring substrate 2. The center position 12 of the semiconductor chip 1 deviates from the center position 13 of the wiring substrate 2 in a direction (the direction of the arrow B) reverse to the deviation direction (the direction of the arrow A) of the center position 11 of the first resin (the underfill resin 4) from the center position 12 of the semiconductor chip 1.

Also, the semiconductor device 10 of the present embodiment includes a wiring substrate 2, a semiconductor chip 1 mounted on the wiring substrate 2 in such a manner that one surface thereof is opposed to one surface of the wiring substrate 2, and a first resin (an underfill resin 4) which is filled in a gap between the surface of the wiring substrate 2 and the surface of the semiconductor chip 1 and part of which protrudes from the gap, and further includes a second resin (a resin for encapsulation 6) formed on the surface of the wiring substrate 2 in such a manner as to cover the semiconductor chip 1 and a portion (a fillet 5) protruding from the gap in the first resin (the underfill resin 4). The center position 11 of the first resin (the underfill resin 4) and the center position 12 of the semiconductor chip 1 deviate from each other in a direction along the surface of the wiring substrate 2. The center position 14 of the second resin (the resin for encapsulation 6) deviates from the center position 13 of the wiring substrate 2 in the same direction (the direction of the arrow A) as the deviation direction (the direction of the arrow A) of the center position 11 of the first resin (the underfill resin 4) from the center position 12 of the semiconductor chip 1.

A method of manufacturing a semiconductor device of the present embodiment includes a first step which involves mounting a semiconductor chip 1 on a wiring substrate 2 in such a manner that one surface of the semiconductor chip 1 is opposed to one surface of the wiring substrate 2, and a second step which involves filling a first resin (an underfill resin 4) in a gap between the surface of the wiring substrate 2 and the surface of the semiconductor chip 1 in such a manner that part of the first resin (the underfill resin 4) protrudes from the gap. In the second step, the first resin (the underfill resin 4) is injected into the gap by use of a first resin injection nozzle (an underfill resin injection nozzle) while the first resin injection nozzle (the underfill resin injection nozzle, not shown) is being moved along any one of sides of the semiconductor chip 1 or along two sides of the semiconductor chip 1 which are adjacent to each other. In the first step, the center position 12 of the semiconductor chip 1 is caused to deviate from the center position 13 of the wiring substrate 2 in the direction in which one or two sides of the semiconductor chip 1 where, in the second step, injection of the first resin (the underfill resin 4) is performed by use of the first resin injection nozzle (the underfill resin injection nozzle), moves away from a semiconductor device end positioned nearest to the relevant side.

Also, a method of manufacturing a semiconductor device of the present embodiment includes a first step which involves mounting a semiconductor chip 1 on a wiring substrate 2 in such a manner that one surface of the semiconductor chip 1 is opposed to one surface of the wiring substrate 2, a second step which involves filling a first resin (an underfill resin 4) in a gap between the surface of the wiring substrate 2 and the surface of the semiconductor chip 1 in such a manner that part of the first resin (the underfill resin 4) protrudes from the gap, and a third step which involves forming a second resin (a resin for encapsulation 6) on the surface of the wiring substrate 2 in such a manner as to cover the semiconductor chip 1 and a portion protruding from the gap in the first resin (the underfill resin 4). In the second step, the first resin (the underfill resin 4) is injected into the gap by use of a first resin injection nozzle (an underfill resin nozzle) while the first resin injection nozzle (the underfill resin injection nozzle, not shown) is being moved along any one of sides of the semiconductor chip 1 or along two sides of the semiconductor chip 1 which are adjacent to each other. In the third step, the center position 14 of the second resin (the resin for encapsulation 6) is caused to deviate from the center position 13 of the wiring substrate 2 in a direction of one side or directions of two sides of the semiconductor chip 1 where, in the second step, injection of the first resin (the underfill resin 4) is performed by use of the first resin injection nozzle (the underfill resin injection nozzle). A detailed description will be given below.

First, the configuration of the semiconductor device 10 will be described.

In the case of this embodiment, the semiconductor device 10 is, for example, a resin-encapsulated FCBGA (flip-chip ball grid array) package.

As shown in FIGS. 1, 3 and 4, the semiconductor device 10 of this embodiment is provided with, for example, a wiring substrate (hereinafter simply called a "board") 2, a semiconductor chip (hereinafter simply called a "chip") 1, an underfill resin 4, a resin for encapsulation 6, bumps 3, PoP lands 7, and BGA balls 8.

One chip 1 is mounted on one surface of the board 2 by the flip-chip mounting method. That is, an electrode pad (not shown) is formed on a surface (the circuit surface) of the chip 1. The board 2 is formed by sequentially stacking an interconnect layer and an insulating layer (not shown), and an electrode pad (not shown) for connection to the chip 1 is formed on a surface of the board 2 (the upper surface of the board 2 of FIG. 1). An electrode pad of the chip 1 and the electrode pad of the board 2 are connected to each other via the bump 3, whereby the chip 1 is mounted on the board 2 in such a manner that one surface of the chip 1 is opposed to one surface of the board 2. Incidentally, the bump 3 is formed from, for example, a solder, gold and copper. Although the thickness of the board 2 is not particularly limited, the thickness can be less than 400 μm, for example.

The chip 1 is formed in the shape of a rectangle (a quadrate or an oblong) as viewed from the plane.

The underfill resin 4 is formed from a thermosetting resin, for example. The underfill resin 4 is filled in a gap between one surface of the board 2 and one surface of the chip 1. Part of the underfill resin 4 protrudes from the gap between the board 2 and the chip 1 as viewed from the plane. This protruding portion is a fillet 5.

The resin for encapsulation 6 is formed on the board 2 in such a manner as to cover the chip 1 and the fillet 5, for example.

PoP (package on package) is a package structure which is constructed by stacking two or more packages and connecting these packages to each other. The PoP land 7 is a land (a terminal) for PoP and used to connect the BGA ball 8 of a lower package and an upper package (not shown) formed on a surface on the opposite side (the upper side in the figure). This PoP land 7 is formed on the board 2 in the circumference of the region where the resin for encapsulation 6 is formed.

The BGA (ball grid array) ball 8 is bonded onto an electrode pad (not shown) formed on a surface of the board 2 on the opposite side of the surface where the chip 1 is mounted.

The movement line 18 shown in FIG. 4 is a movement line of a leading end position 17 of the underfill resin injection nozzle (not shown) during the formation of the underfill resin 4. The underfill resin injection nozzle is formed from a needle, for example. This embodiment is, as shown in FIG. 4, an example in which the underfill resin 4 was filled in (injected into) the gap between the board 2 and the chip 1 while the underfill resin injection nozzle was being moved along one side of the chip 1 (for example, the lower side of FIG. 4).

For this reason, the fillet 5 is relatively large in a portion along one side of the chip 1 and is relatively small in portions along other sides. That is, in the fillet 5, for example, the portion along the left side of FIG. 1 (the lower side of FIGS. 3 and 4) in the chip 1 is a large-sized portion 5a where the width W1 of a portion protruding from the gap between the board 2 and the chip 1 is relatively large, whereas portions along other sides (the right side, front and back sides of FIG. 1, the upper side, right and left sides of FIGS. 3 and 4) are small-sized portions 5b where the width W2 of a portion protruding from the gap between the board 2 and the chip 1 is relatively small.

As described above, the fillet 5 is asymmetrical (laterally asymmetrical in FIG. 1, vertically asymmetrical in FIGS. 3 and 4) with reference to the center position 12 of the chip 1 in a direction along one surface of the board 2. That is, the center position 11 of the fillet 5 in a direction along one surface of the board 2 deviates, in FIGS. 1 and 2, in the left direction (the direction of the arrow A) of the center position 12 of the chip 1, and deviates, in FIGS. 3 to 5, in the downward direction (the direction of the arrow A) of the center position 12. In this manner, the asymmetry of the shape of the fillet 5 occurs because the width of the fillet 5 (the large-sized portion 5a) of an underfill resin injected side (for example, the lower side of FIGS. 3 and 4) in the circumference of the chip 1 becomes larger than the width of the fillet 5 (the small-sized portion 5b) of other sides.

A portion composed of the chip 1, the board 2 and the bumps 3 is called a flip-chip mounted body. The center position 13 of the board 2 in a direction along one surface of the board 2 is also the center position of the flip-chip mounted body, and is also the center position of the semiconductor device (the semiconductor package) 10.

In the case of this embodiment, for example, the amount of deviation S1 of the center position 12 of the chip 1 in a direction along one surface of the board 2 from the center position 13 of the board 2 is larger than 0, and the center position 12 deviates from the center position 13 in the right direction of FIGS. 1 and 2 (the upward direction of FIGS. 3 to 5). As described above, the width W1 of the fillet 5 of an underfill resin injected side becomes larger than the width W2 of the fillet 5 of other sides. For this reason, the direction in which the center position 12 of the chip 1 is caused to deviate from the center position 13 of the board 2 is set in the direction in which an underfill resin injected side of the chip 1 moves away from an end (an edge) of the semiconductor device 10. That is, the center position 12 of the chip 1 is caused to deviate from the center position 13 of the wiring substrate 2 in the direction in which one side (an underfill resin injected side) of the chip 1, where injection of the underfill resin 4 is performed by use of the underfill resin injection nozzle, moves away from an end (an edge) of the semiconductor device positioned nearest to the side in question. In other words, the center position 12 of the chip 1 deviates from the center position 13 of the board 2 in a direction (the direction of the arrow B in FIGS. 1 to 5) reverse to the deviation direction (the direction of the arrow A in FIGS. 1 to 5) of the center position 11 of the underfill resin 4 from the center position 12 of the chip 1. That is to say, the center position 12 of the chip 1 deviates from the center position 13 of the board 2 toward the small-sized portion 5b side of the fillet 5. If differently expressed, the center position 12 of the chip 1 deviates from the center position 13 of the board 2 in a direction of a side opposed to an underfill resin injected side.

In the case of this embodiment, for example, the amount of deviation S2 of the center position 14 of the resin for encapsulation 6 in a direction along one surface of the board 2 from the center position 13 of the board 2 is larger than 0, and the center position 14 deviates from the center position 13 in the left direction of FIGS. 1 and 2 (the downward direction of FIGS. 3 to 5). In other words, the center position 14 of the resin for encapsulation 6 deviates from the center position 13 of the board 2 in the same direction (the direction of the arrow A in FIGS. 1 to 5) as the deviation direction (the direction of the arrow A in FIGS. 1 to 5) of the center position 11 of the underfill resin 4 from the center position 12 of the chip 1. That is, the center position 14 of the resin for encapsulation 6 is caused to deviate from the center position 13 of the wiring substrate 2 in a direction of one side (an underfill resin injected side) of the chip 1 where injection of the underfill resin 4 is performed by use of the underfill resin injection nozzle. That is to say, the center position 14 of the resin for encapsulation 6 deviates from the center position 13 of the board 2 toward the large-sized portion 5a side of the fillet 5. If differently expressed, the center position 14 of the resin for encapsulation 6 deviates from the center position 13 of the board 2 in the direction of an underfill resin injected side.

Thus, in the case of this embodiment, for example, the amount of deviation S1>0 and the amount of deviation S2>0. However, only either of the amount of deviation S1 or the amount of deviation S2 may be larger than 0.

Next, the method of manufacturing a semiconductor device of this embodiment will be described with reference to FIGS. 6A to 6E.

Incidentally, the flow of a series of steps in the manufacturing method of the semiconductor device shown in FIGS. 6A to 6E is the same as in each embodiment except the first embodiment and, therefore, part of the manufacturing method of the semiconductor device is partially or totally omitted in each embodiment except the first embodiment.

Figure 6A:
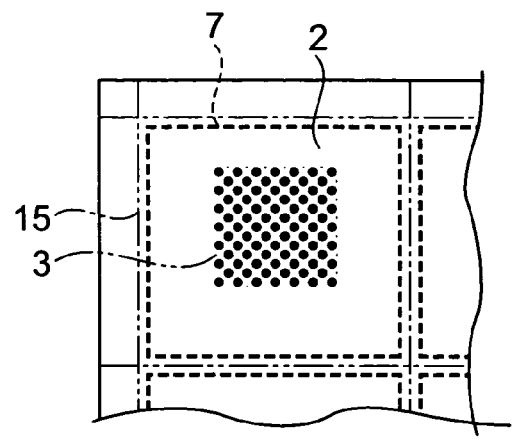
FIGS. 6A to 6E are plan views showing the flow of a series of steps to explain the manufacturing method of the semiconductor device of the first embodiment.

First, as shown in FIG. 6A, bumps 3 and a PoP land 7 are formed on a board 2. The bumps 3 are each formed on electrode pads for flip-chip mounting (not shown) which are formed beforehand on the board 2.

Figure 6B:
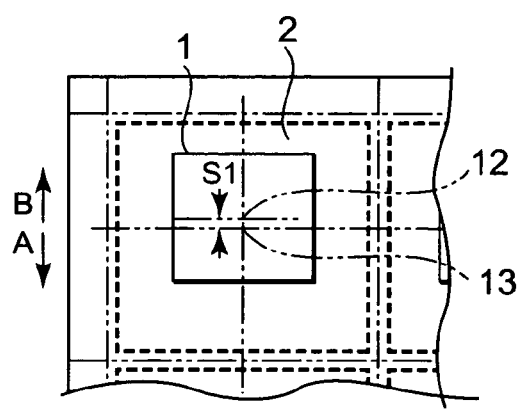
Figure 6C:
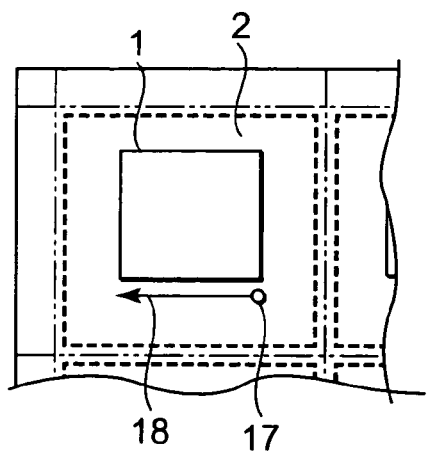

Next, as shown in FIG. 6B, a chip 1 is flip-chip mounted on the board 2. This mounting is performed in such a manner that the center position 12 of the chip 1 deviates from the center position 13 of the board 2 (concretely, for example, in the right direction of FIGS. 1 and 2, in the upward direction of FIGS. 3 to 5). Incidentally, it is possible to perform mounting in such a manner that the center position 12 of the chip 1 deviates from the center position 13 of the board 2 by beforehand arranging and designing electrode pads for flip-chip mounting (not shown) of the board 2 so that the center position 12 of the chip 1 deviates from the center position 13 of the board 2 like this.

Such mounting of the chip 1 is usually performed at high temperatures of not less than 230° C. For this reason, when the high temperatures return to room temperature after mounting, due to a difference between the coefficient of thermal expansion of the chip 1 and the coefficient of thermal expansion of the board 2, an upward convex bow occurs in a flip-chip mounted body, if the board 2 is positioned below and the chip 1 is positioned above. For example, when the bumps 3 are formed from a lead-free solder, this bow occurs due to a difference in the coefficient of thermal expansion between the board 2 and the chip 1 during the cooling of the bumps 3 to room temperature after the chip 1 is connected to the board 2 by melting the bumps 3 at high temperatures of not less than 250° C. The coefficient of thermal expansion of the board 2 is, for example, five to ten times that of the chip 1. Incidentally, when the bumps 3 are formed from a lead-free solder, the effect of an underfill resin 4 on a bow is a limited one, and hence it may be thought that the greater part of the bow of a flip-chip mounted body is inherited from a bow in the flip-chip mounting step, which is the preceding step.

After the flip-chip mounting, the underfill resin 4 is injected by use of an underfill resin injection nozzle (not shown) composed of a needle and the like. In the case of this embodiment, as indicated by a movement line 18 shown in FIG. 4 and FIG. 6C, the underfill resin 4 is injected into the gap between the wiring substrate 2 and the semiconductor chip 1 by use of the underfill resin injection nozzle while the underfill resin injection nozzle is being moved linearly (in the manner of the letter I) along one side of the chip 1 (concretely, for example, the left side of FIG. 1, the lower side of FIGS. 6C and 3).

Figure 6D:
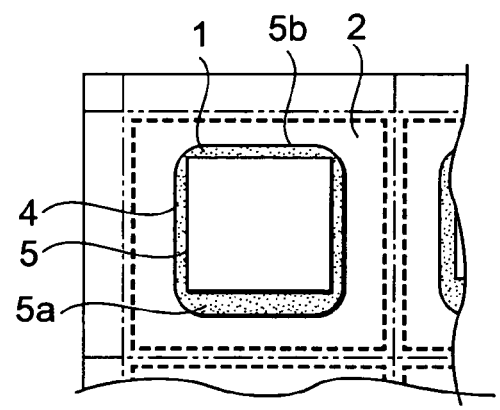

FIG. 6D shows the condition after the injection of an underfill resin. As shown in FIG. 6D, a fillet 5 of the underfill resin 4 is formed in the circumference of the chip 1. The width of the fillet 5 of the underfill resin 4 is larger in a portion along the side of the circumference of the chip 1 where injection was performed (concretely, for example, the left side of FIG. 1, the lower side of FIGS. 3, 4 and 6D) than in portions along other sides (for example, the right side, front and back sides of FIG. 1, the right and left sides and upper side of FIGS. 3, 4 and 6D). That is, the fillet 5 of the underfill resin 4 becomes a large-sized portion 5a, which is relatively large, in a portion along the side of the circumference of the chip 1 where the injection was performed, and becomes a small-sized portion 5b, which is relatively small, in portions along other sides. That is, in other sides, the underfill resin 4 is caused to penetrate (is injected) into the gap between the chip 1 and the board 2 by the capillary phenomenon and hence there occurs a small fillet shape of such an extent that the underfill resin 4 wets the circumference of the chip 1.

The direction in which the center position 12 of the chip 1 is caused to deviate from the center position 13 of the board 2 in the mounting of the chip 1 (the direction of the arrow B of FIGS. 1 to 5 and FIG. 6B) is a direction reverse to the deviation direction of the center position 11 of the underfill resin 4 from the center position 12 of the chip 1 (the direction of the arrow A of FIGS. 1 to 5). In other words, the center position 12 of the chip 1 is caused to deviate from the center position 13 of the board 2 toward a direction reverse to the side where the injection of the underfill resin 4 is performed as viewed from the center position 12 of the chip 1.

When the injection (filling) of the underfill resin 4 is completed, the underfill resin 4 is caused to set by heating the flip-chip mounted body. Although the condition of the bow of the flip-chip mounted body changes more or less as the underfill resin 4 sets, basically the bow still remains an upward convex bow.

Figure 6E:
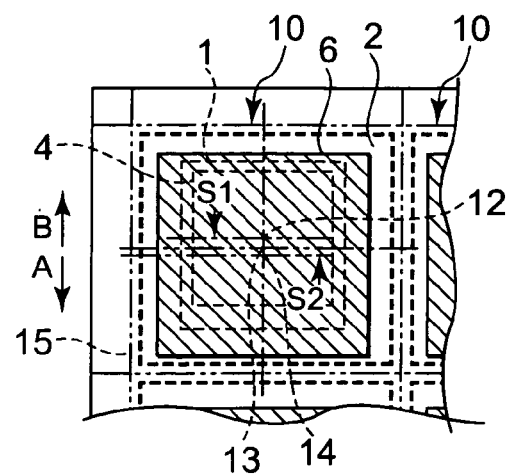

When the setting of the underfill resin 4 is completed, as shown in FIG. 6E, the encapsulation of the flip-chip mounted body with the resin for encapsulation 6 is performed. Usually, the resin for encapsulation 6 is formed only on the front surface side of the board 2, i.e., the side where the chip 1 is mounted.

Specific examples of values of physical properties of each of the resin for encapsulation 6, the underfill resin 4, the board 2, and the chip 1 will be described. For the resin for encapsulation 6, for example, Tg (the glass transition temperature) is 120 to 130° C., $\alpha 1$ (the coefficient of linear expansion at less than Tg) is 30 to 40 ppm/° C., and $\alpha 2$ (the coefficient of linear expansion at not less than Tg) is 80 to 120 ppm/° C.). For the underfill resin 4, for example, Tg is 135 to 145° C., $\alpha 1$ is 20 to 30 ppm/° C., and $\alpha 2$ is 80 to 100 ppm/° C. For the board 2, for example, Tg is 160 to 190° C., $\alpha 1$ is 15 to 30 ppm/° C., and $\alpha 2$ is 10 to 35 ppm/° C. For the chip 1, for example, $\alpha$ (the coefficient of linear expansion) is 3 to 5 ppm/° C. In general, when the coefficient of thermal expansion (concretely, for example, the coefficient of linear expansion) of the resin for encapsulation 6 is larger than the coefficient of thermal expansion of the underfill resin 4, the package bow reducing effect (the bow correcting effect) is dependent on the resin for encapsulation 6 (the contractive force of the resin for encapsulation 6 becomes predominant over the bow shape of the package). Also when Tg of the resin for encapsulation 6 is lower than Tg of the underfill resin 4, the package bow reducing effect (the bow correcting effect) is dependent on the resin for encapsulation 6 (the contractive force of the resin for encapsulation 6 becomes predominant over the bow shape of the package). That is, the lower Tg of the resin for encapsulation 6, the wider the temperature region (temperature range) in which the coefficient of thermal expansion (concretely, for example, the coefficient of linear expansion) of the resin for encapsulation 6 becomes larger than the coefficient of thermal expansion of the underfill resin 4, and in this sense, the lower Tg of the resin for encapsulation 6, the more the contractive force of the resin for encapsulation 6 will be predominant over the bow shape of the package.

In this embodiment, for example, the coefficient of thermal expansion of the resin for encapsulation 6 is larger than the coefficient of thermal expansion of the underfill resin 4, and Tg of the resin for encapsulation 6 is smaller than Tg of the underfill resin 4. That is, in this embodiment, the case where the resin for encapsulation 6 is predominant over a bow is assumed.

In the case of this embodiment, the encapsulation with the resin for encapsulation 6 is performed for each semiconductor device 10. That is, the semiconductor device 10 of this embodiment is a singulated encapsulation type.

The encapsulation with the resin for encapsulation 6 is performed in such a manner that the center position 14 thereof deviates from the center position 13 of the board 2 (concretely, for example, in the left direction of FIGS. 1 and 2, in the downward direction of FIGS. 3 to 5). The direction in which the center position 14 of the resin for encapsulation 6 is caused to deviate from the center position 13 of the board 2 (the direction of the arrow A in FIGS. 1 to 5) is the same direction as the deviation direction (the direction of the arrow A in FIGS. 1 to 5) of the center position 11 of the underfill resin 4 from the center position 12 of the chip 1. In other words, encapsulation is performed in such a manner that the center position 14 of the resin for encapsulation 6 deviates from the center position 13 of the board 2 in the same direction as the side where the injection of the underfill resin 4 is performed as viewed from the center position 12 of the chip 1.

Incidentally, the amount of deviation S1 of the center position 12 of the chip 1 from the center position 13 of the board 2 and the amount of deviation S2 of the center position 14 of the resin for encapsulation 6 from the center position 13 of the board 2, which depend on the physical properties and sizes of the chip 1, the board 2, the underfill resin 4 and the resin for encapsulation 6, are set as follows when a flip-chip mounted body into which the underfill resin 4 is injected and caused to set is encapsulated with a liquid resin (overmolded). That is, it is preferred that the amount of deviation S1 be smaller than, for example, a maximum value of the protruding width of the underfill resin 4 from the gap between the chip 1 and the board 2 (the protruding width W1). Furthermore, it is preferred that the amount of deviation S1 be, for example, not less than 1/100 of a maximum value of the protruding width of the underfill resin 4 from the gap between the chip 1 and the board 2 (the protruding width W1). It is preferred that the amount of deviation S2 be smaller than a maximum value of the protruding width of the underfill resin 4 from the gap between the chip 1 and the board 2 (the protruding width W1).

After the formation of the resin for encapsulation 6, the BGA balls 8 are formed on the board 2. Furthermore, each package (semiconductor device 10) is separated by cutting the board 2 along a dicing line 15 shown in FIGS. 3, 4 and 6E. As a result of this, it is possible to obtain the semiconductor device 10 shown in FIG. 1.

Figure 25:
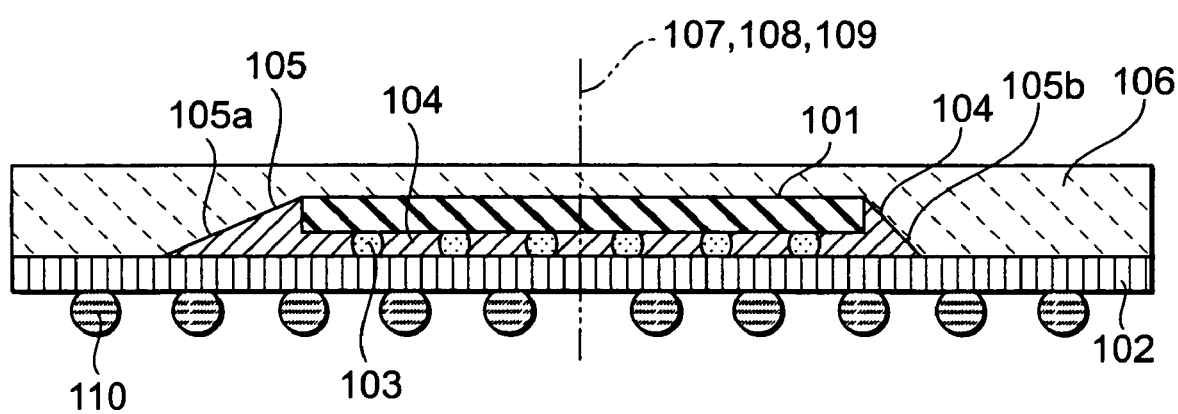
FIG. 25 is a sectional view of a general semiconductor device.
Figure 26:
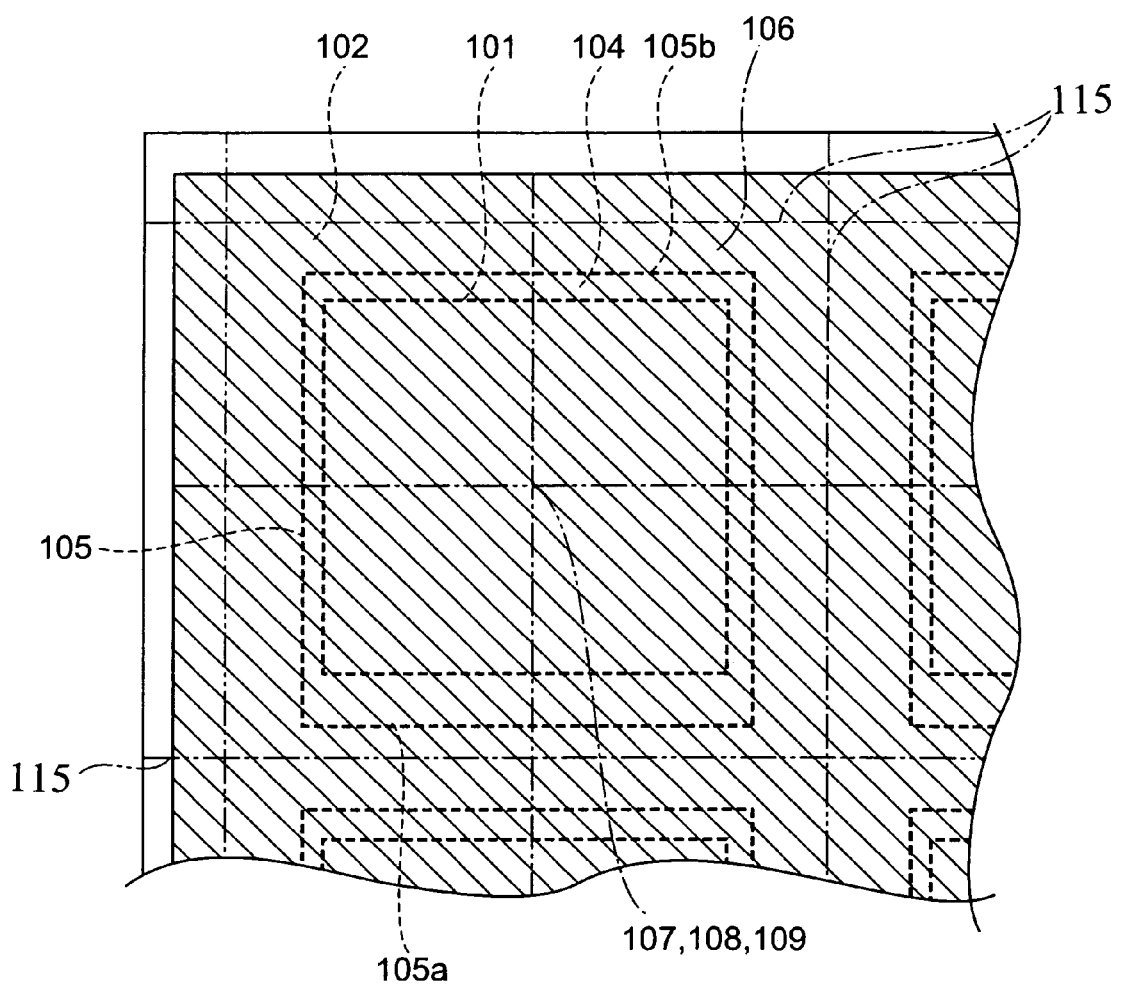
FIG. 26 is a plan view of the semiconductor device of FIG. 25.

In the case of a general semiconductor device, as shown in FIGS. 25 and 26, the center position 108 of the board 102 and the center position 107 of the chip 101 coincide with each other and, therefore, the distribution of the amount of the underfill resin 104 becomes asymmetrical. Contrastingly, in this embodiment, the center position 12 of the chip 1 is arranged by being caused to deviate from the center position 13 of the board 2, whereby it is possible to improve the balance of the distribution of the amount of the underfill resin 4 with reference to the center of the package (the center position 13 of the board 2). Hence, it is possible to improve the symmetrical characteristic of the effect of the underfill resin 4 on a bow. As a result of this, it is possible to improve the bow behavior of the semiconductor device 10 to a condition close to symmetry. Furthermore, the resin for encapsulation 6 is formed by causing the center position 14 of the resin for encapsulation 6 to deviate from the center position 13 of the board 2, whereby it is possible to improve the balance of the distribution of the amount of the resin for encapsulation 6 with reference to the center of the package (the center position 13 of the board 2). That is, it is possible to increase the amount of the resin for encapsulation 6 in a portion of the fillet 5 having a large volume (the portion along the left side of the chip 1 in FIG. 1, the portion along the lower side of the chip 1 in FIG. 3). Also, it is possible to reduce the amount of the resin for encapsulation 6 in portions of the fillet 5 having a small volume (portions along the right, front and back sides of the chip 1 in FIG. 1, portions along the upper, right and left sides of the chip 1 in FIG. 3). The center position 12 of the chip 1 and the center position 14 of the resin for encapsulation 6 are caused to deviate like this, whereby it is possible to reduce the uneven distribution of the amount of the resin for encapsulation 6 and to improve the symmetrical characteristic of the bow correcting effect of the resin for encapsulation 6. As a result, it is possible to improve the bow behavior of the semiconductor device 10 to a condition close to symmetry. Hence, it is possible to suppress the extent of a bow of the semiconductor device 10. That is, if a bow is asymmetrical, the bow warps greatly on one side of the semiconductor device 10, whereas making a bow symmetrical enables the amount of bow on the side where the bow is large to be reduced. Hence, it is possible to improve the mountability and mounting reliability of the semiconductor device 10.

According to the first embodiment described above, the semiconductor device 10 of the present invention includes the wiring substrate 2, the semiconductor chip 1 mounted on the wiring substrate 2 in such a manner that one surface thereof is opposed to one surface of the wiring substrate 2, and the first resin (the underfill resin 4) which is filled in a gap between the surface of the wiring substrate 2 and the surface of the semiconductor chip 1 and part of which protrudes from the gap. The center position 11 of the first resin (the underfill resin 4) and the center position 12 of the semiconductor chip 1 deviate from each other in a direction along the surface of the wiring substrate 2. The center position 12 of the semiconductor chip 1 deviates from the center position 13 of the wiring substrate 2 in a direction (the direction of the arrow B) reverse to the deviation direction (the direction of the arrow A) of the center position 11 of the first resin (the underfill resin 4) from the center position 12 of the semiconductor chip 1.

Accordingly, it is possible to improve the balance of the distribution of the amount of the underfill resin 4 in the whole semiconductor device 10 and it is possible to improve the symmetrical characteristic of a bow in the whole semiconductor device 10. Hence, it is possible to suppress the bow of the semiconductor device 10 and thereby to improve the mountability and mounting reliability of the semiconductor device 10. Also, it is possible to improve the symmetrical characteristic of a bow without the addition of component elements and, therefore, compared to the technique of Japanese Patent Laid-Open No. 11-017070, it is possible to prevent the size of the semiconductor device 10 from becoming large and it is possible to prevent the manufacturing cost from increasing.

Also, the semiconductor device 10 of the present invention includes the wiring substrate 2, the semiconductor chip 1 mounted on the wiring substrate 2 in such a manner that one surface thereof is opposed to one surface of the wiring substrate 2, the first resin (the underfill resin 4) which is filled in a gap between the surface of the wiring substrate 2 and the surface of the semiconductor chip 1 and part of which protrudes from the gap, and the second resin (the resin for encapsulation 6) formed on the surface of the wiring substrate 2 in such a manner as to cover the semiconductor chip 1 and the portion (the fillet 5) protruding from the gap in the first resin (the underfill resin 4). The center position 11 of the first resin (the underfill resin 4) and the center position 12 of the semiconductor chip 1 deviate from each other in a direction along the surface of the wiring substrate 2. The center position 14 of the second resin (the resin for encapsulation 6) deviates from the center position 13 of the wiring substrate 2 in the same direction (the direction of the arrow A) as the deviation direction (the direction of the arrow A) of the center position 11 of the first resin (the underfill resin 4) from the center position 12 of the semiconductor chip 1.

Accordingly, it is possible to improve the balance of the distribution of the amount of the resin for encapsulation 6 in the whole semiconductor device 10 and it is possible to improve the symmetrical characteristic of a bow in the whole semiconductor device 10. Hence, it is possible to suppress the bow of the semiconductor device 10 and thereby to improve the mountability and mounting reliability of the semiconductor device 10. Also, it is possible to improve the symmetrical characteristic of a bow without the addition of component elements and, therefore, compared to the technique of Japanese Patent Laid-Open No. 11-017070, it is possible to prevent the size of the semiconductor device 10 from becoming large and it is possible to prevent the manufacturing cost from increasing.

In general, the thickness of the underfill resin 4 is on the order of several μm, for example, whereas the thickness of the resin for encapsulation 6 is on the order of 100 μm, for example. The resin for encapsulation 6, which has a higher filler content than the underfill resin 4, has a higher rigidity than the underfill resin 4. For these reasons, the bow correcting effect of the resin for encapsulation 6 is greater than the effect of the underfill resin 4 on a bow. For this reason, it can be expected that the bow improving effect of the adjustment of the amount of deviation S2 is greater than the bow improving effect of the adjustment of the amount of deviation S1.

Incidentally, in the above-described first embodiment, the description was given of the case where the semiconductor device is provided with the PoP land 7 for package on package (PoP). However, it is not always necessary that the semiconductor device be provided with the PoP land 7, and also in this case, it is possible to obtain the same effect as described above.

Second Embodiment

Figure 7:
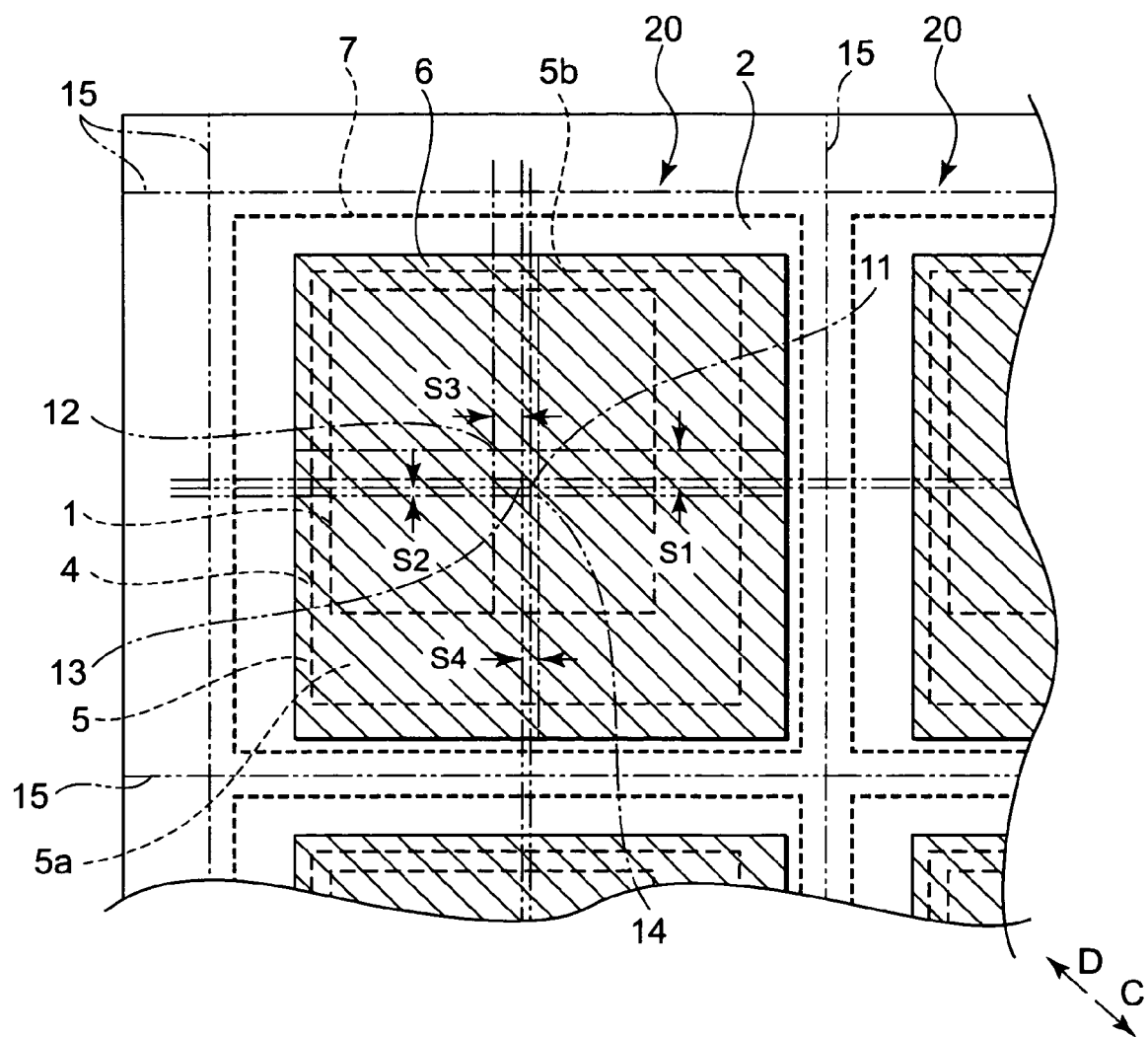
FIG. 7 is a plan view showing the semiconductor device of the second embodiment.
Figure 8:
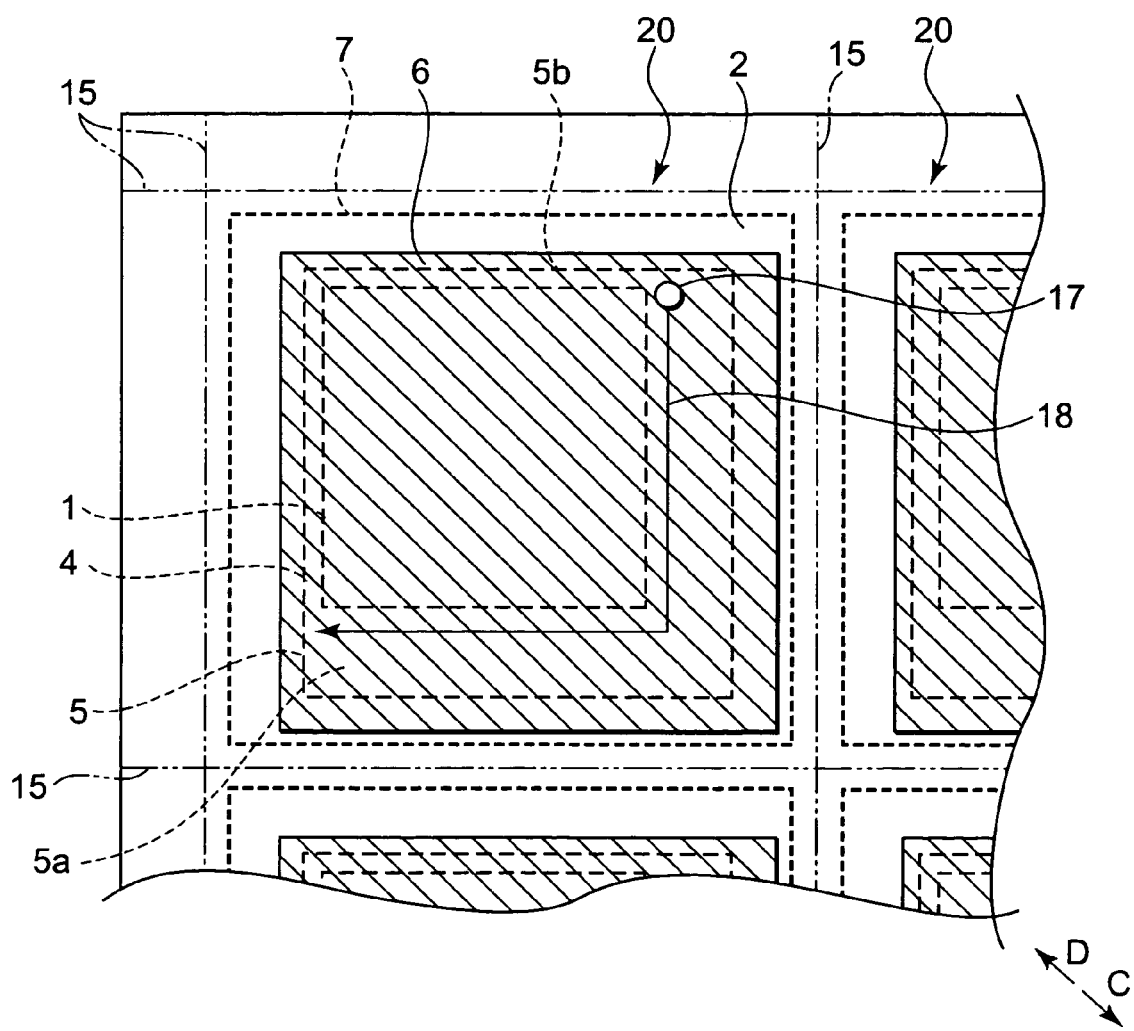
FIG. 8 is a plan view showing the action of an underfill resin injection nozzle during the formation of an underfill resin in the semiconductor device of the second embodiment.
Figure 9:
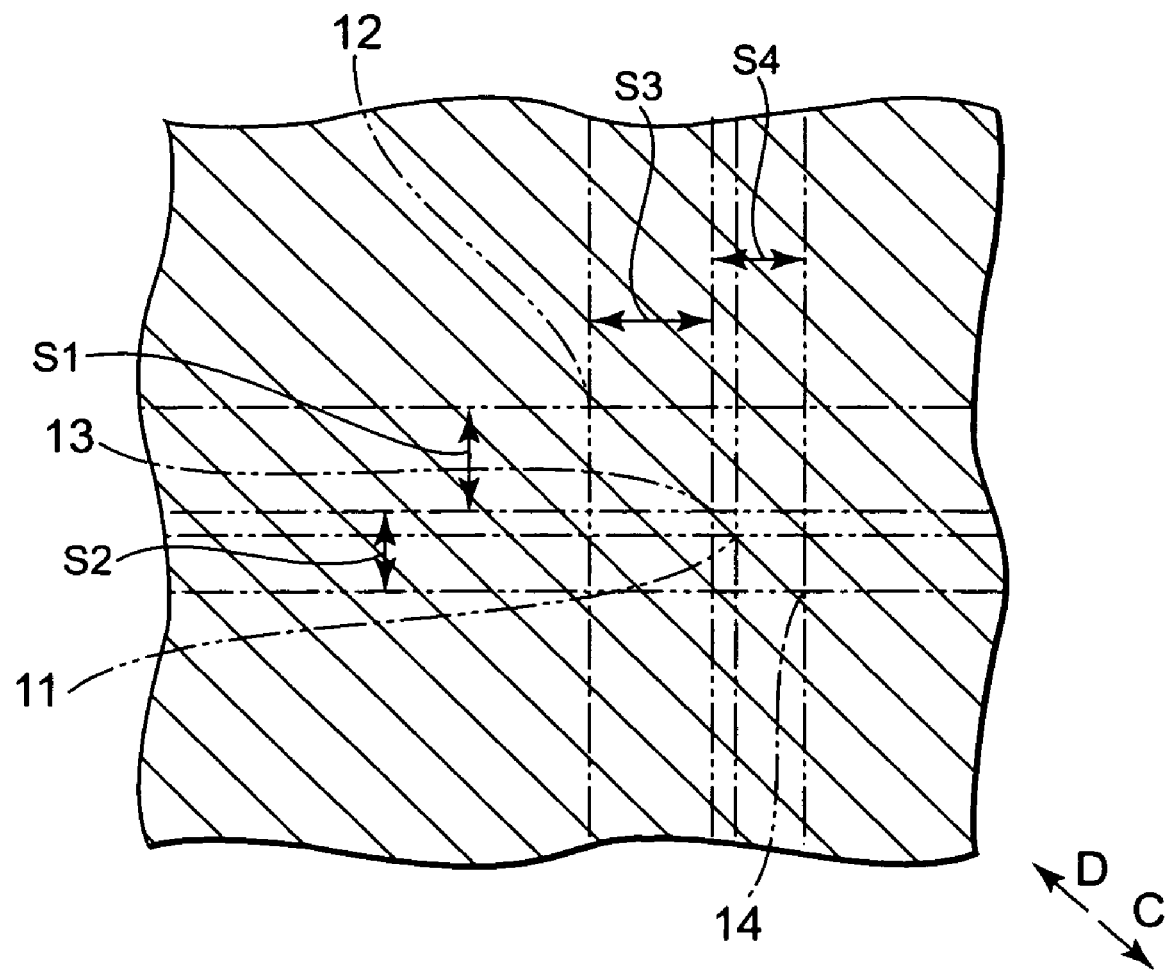
FIG. 9 is an enlarged view of an essential portion of FIG. 7.

FIGS. 7 and 8 are plan views of the semiconductor device 20 of the second embodiment. FIG. 9, is an enlarged view of an essential portion of FIG. 7. FIG. 8 shows the action (a movement line 18) of an underfill resin injection nozzle (not shown) during the formation of an underfill resin 4. Incidentally, FIGS. 7 and 8 show the state before the singulation of each semiconductor device (package) 20. FIGS. 1 and 2, which were described in connection with the semiconductor device 10, serve also as sectional views of the semiconductor device 20.

The movement line 18 shown in FIG. 8 is a movement line of a leading end position 17 of an underfill resin injection nozzle (not shown) during the formation of the underfill resin 4 in the case of this embodiment. This embodiment is a case where, as shown in FIG. 8, the underfill resin 4 is injected into the gap between a board 2 and a semiconductor chip 1 while the underfill resin injection nozzle is being moved in a manner of the letter L along two sides of the chip 1 which are adjacent to each other (for example, the right side and the lower side of FIG. 8).

For this reason, the fillet 5 is relatively large in a portion along the two sides of the chip 1 which are adjacent to each other and is relatively small in portions along other sides. That is, in the fillet 5, the portion, for example, along the right side and lower side of FIGS. 7 and 8 (the front side and left side of FIG. 1) in the chip 1 is a large-sized portion 5a where the width W1 of a portion protruding from the gap between the board 2 and the chip 1 is relatively large, whereas portions along other sides (the left side and upper side of FIG. 7, the right side and back side of FIG. 1) are small-sized portions 5b where the width W2 of a portion protruding from the gap between the board 2 and the chip 1 is relatively small.

As described above, the fillet 5 is asymmetrical with reference to the center position 12 of the chip 1 in a direction along one surface of the board 2. That is, the center position 11 of the fillet 5 in a direction along one surface of the board 2 deviates, in FIGS. 7 and 9, in the downward right direction (the direction of the arrow C in FIGS. 7 and 9) of the center position 12 of the chip 1. In this manner, the asymmetry of the shape of the fillet 5 occurs because the width of the fillet 5 (the large-sized portion 5a) of an underfill resin injected side (for example, the right side and lower side of FIGS. 7 and 8) in the circumference of the chip 1 becomes larger than the width of the fillet 5 (the small-sized portion 5b) of other sides.

In the case of this embodiment, for example, the amount of deviation S1 of the center position 12 of the chip 1 from the center position 13 of the board 2 in a direction along one surface of the board 2 and parallel to the left side and right side of the chip 1 in FIGS. 7 and 8 is larger than 0. Also, for example, the amount of deviation S3 of the center position 12 of the chip 1 from the center position 13 of the board 2 in a direction along one surface of the board 2 and parallel to the upper side and lower side of the chip 1 in FIGS. 7 and 8 is larger than 0. Furthermore, the center position 12 deviates from the center position 13 in the upward left direction (the direction of the arrow D) of FIGS. 7 to 9. As described above, the width W1 of the fillet 5 of an underfill resin injected side becomes larger than W2 of the fillet 5 of other sides. For this reason, the direction in which the center position 12 of the chip 1 is caused to deviate from the center position 13 of the board 2 is set in the direction in which an underfill resin injected side of the chip 1 moves away from an end (an edge) of the semiconductor device 10. That is, the center position 12 of the chip 1 is caused to deviate from the center position 13 of the wiring substrate 2 in the direction in which each of the two sides where the injection of the underfill resin 4 is performed by use of the underfill resin injection nozzle (the underfill resin injected sides) moves away from each end (edge) of the semiconductor device positioned nearest to the two sides in question. In other words, the center position 12 of the chip 1 deviates from the center position 13 of the board 2 in a direction (the direction of the arrow C of FIGS. 7 to 9) reverse to the deviation direction (the direction of the arrow C of FIGS. 7 to 9) of the center position 11 of the underfill resin 4 from the center position 12 of the chip 1. That is to say, the center position 12 of the chip 1 deviates from the center position 13 of the board 2 in a direction diagonal to an angle between the two underfill resin injected sides.

In the case of this embodiment, for example, the amount of deviation S2 of the center position 14 of the resin for encapsulation 6 from the center position 13 of the board 2 in a direction along one surface of the board 2 and parallel to the left side and right side of the chip 1 in FIGS. 7 and 8 is larger than 0. Furthermore, for example, the amount of deviation S4 of the center position 14 of the resin for encapsulation 6 from the center position 13 of the board 2 in a direction along one surface of the board 2 and parallel to the upper side and lower side of the chip 1 in FIG. 7 is larger than 0. And the center position 14 deviates from the center position 13 in the downward right direction (the direction of the arrow C) in FIGS. 7 to 9. In other words, the center position 14 of the resin for encapsulation 6 deviates from the center position 13 of the board 2 in the same direction (the direction of the arrow C in FIGS. 7 to 9) as in the deviation direction (the direction of the arrow C in FIGS. 7 to 9) of the center position 11 of the underfill resin 4 from the center position 12 of the chip 1. That is, the center position 14 of the resin for encapsulation 6 is caused to deviate from the center position 13 of the wiring substrate 2 in the direction of the two sides (the underfill resin injected sides) of the chip 1 where the injection of the underfill resin 4 is performed by use of the underfill resin injection nozzle. That is to say, the center position 14 of the resin for encapsulation 6 deviates from the center position 13 of the board 2 in a direction of an angle between the two underfill resin injected sides.

Thus, in the case of this embodiment, for example, the amount of deviation S1>0 and the amount of deviation S3>0. At the same time, the amount of deviation S2>0 and the amount of deviation S4>0. However, it is also permissible that the amount of deviation S2=0 and that the amount of deviation S4=0, although the amount of deviation S1>0 and the amount of deviation S3>0. Alternatively, it is also permissible that the amount of deviation S2>0 and that the amount of deviation S4>0, although the amount of deviation S1=0 and the amount of deviation S3=0.

Next, the method of manufacturing a semiconductor device of this embodiment will be described.

In the case of this embodiment, the mounting of the chip 1 on the board 2 is performed in such a manner that, for example, the center position 12 of the chip 1 deviates from the center position 13 of the board 2 in the upward left direction (the direction of the arrow D) of FIGS. 7 to 9. Incidentally, it is possible to perform mounting in such a manner that the center position 12 of the chip 1 deviates from the center position 13 of the board 2 by beforehand arranging and designing electrode pads for flip-chip mounting of the board 2 so that the center position 12 of the chip 1 deviates from the center position 13 of the board 2 like this.

Also, in the case of this embodiment, the injection of the underfill resin 4 is performed, as indicated by a movement line 18 in FIG. 8, while the underfill resin injection nozzle (not shown) is being moved along the two sides of the chip 1 which are adjacent to each other (for example, the right side and the lower side of FIGS. 7 and 8).

The fillet 5 of the underfill resin 4 becomes a large-sized portion 5a, which is relatively large, in a portion along the side where injection was performed in the circumference of the chip 1 (for example, the right side and lower side of FIGS. 7 and 8), and becomes a small-sized portion 5b, which is relatively small, in portions along other sides (for example, the left side and upper side of FIGS. 7 and 8).

When the injection of the underfill resin 4 is completed, the underfill resin 4 is caused to set by heating the flip-chip mounted body.

Next, the flip-chip mounted body into which the underfill resin 4 is filled and is caused to set is encapsulated with the resin for encapsulation 6. Resin encapsulation is performed in such a manner that, for example, the center position 14 of the resin for encapsulation 6 deviates from the center position 13 of the board 2 in the downward right direction of FIGS. 7 to 9 (the direction of the arrow C).

The center position 14 of the resin for encapsulation 6 is caused to deviate from the center position 13 of the board 2 like this, whereby is possible to improve the balance of the amount of the resin for encapsulation with reference to the center of a package (the center position 13 of the board 2).

The center position 12 of the chip 1 and the center position 14 of the resin for encapsulation 6 are caused to deviate like this, whereby it is possible to reduce the substantial uneven distribution of the amount of the resin for encapsulation 6 and to improve the bow behavior of the semiconductor device 20 to a condition close to symmetry.

Incidentally, the range of the amounts of deviation S1 and S2 is the same as in the above-described first embodiment. The range of the amount of deviation S3 is the same as in the amount of deviation S1, and the range of the amount of deviation S4 is the same as in the amount of deviation S2.

However, because it is possible to set the protruding width of the fillet 5 in each side of the chip 1 to different values according to the injection method of the underfill resin 4, it is not necessary that the amounts of deviation S1 and S3 be equal to each other. Similarly, it is not necessary that the amounts of deviation S2 and S4 be equal to each other. This applies also to the fourth embodiment, which will be described later with the aid of FIG. 15 and other figures, and the sixth embodiment, which will be described later with the aid of FIG. 21 and other figures.

It is possible to obtain the semiconductor device 20 of the present embodiment shown in FIGS. 7 and 8 by performing other steps in the same way as in the first embodiment.

According to the second embodiment, it is possible to obtain the same effect as in the above-described first embodiment when the injection of the underfill resin 4 is performed along two sides of the chip 1 which are adjacent to each other, in other words, in the case where the protruding width of the underfill resin 4 from the gap between the board 2 and the chip 1 is relatively large in a portion along the two sides of the chip 1 which are adjacent to each other in the underfill resin 4, and is relatively small in portions along other sides.

Third Embodiment

Figure 10:
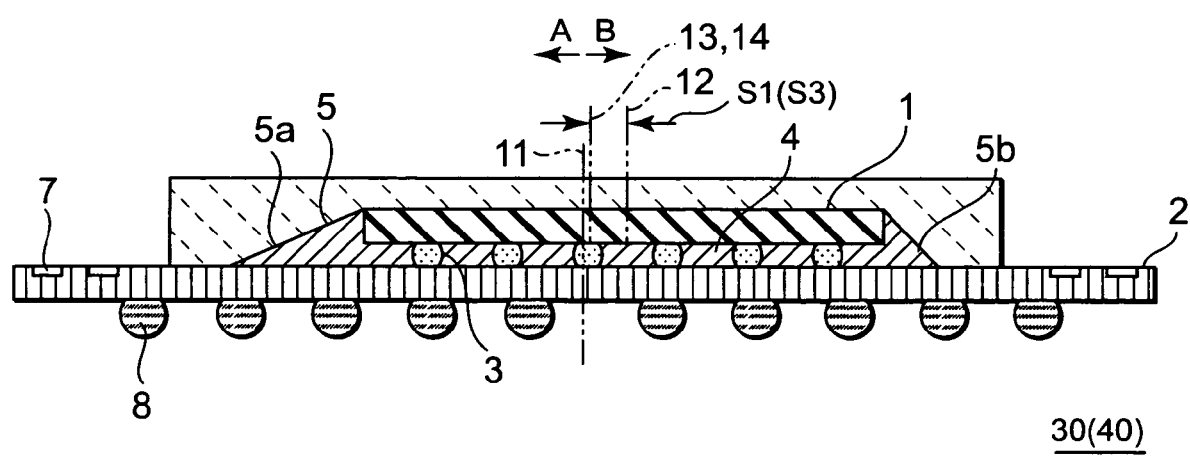
FIG. 10 is a sectional view common to semiconductor devices of the third and fourth embodiments.
Figure 11:
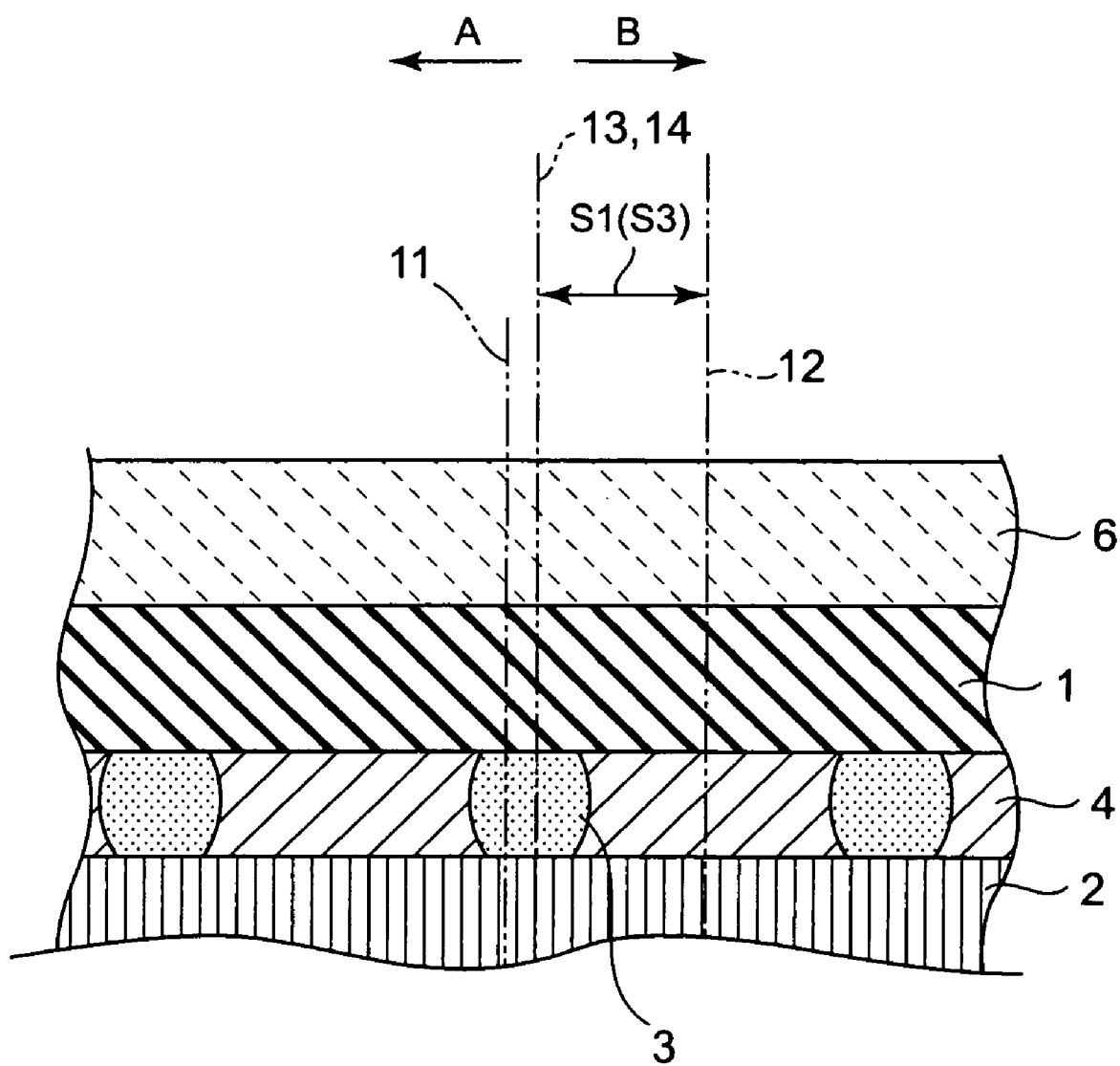
FIG. 11 is an enlarged view of an essential portion of FIG. 10.
Figure 12:
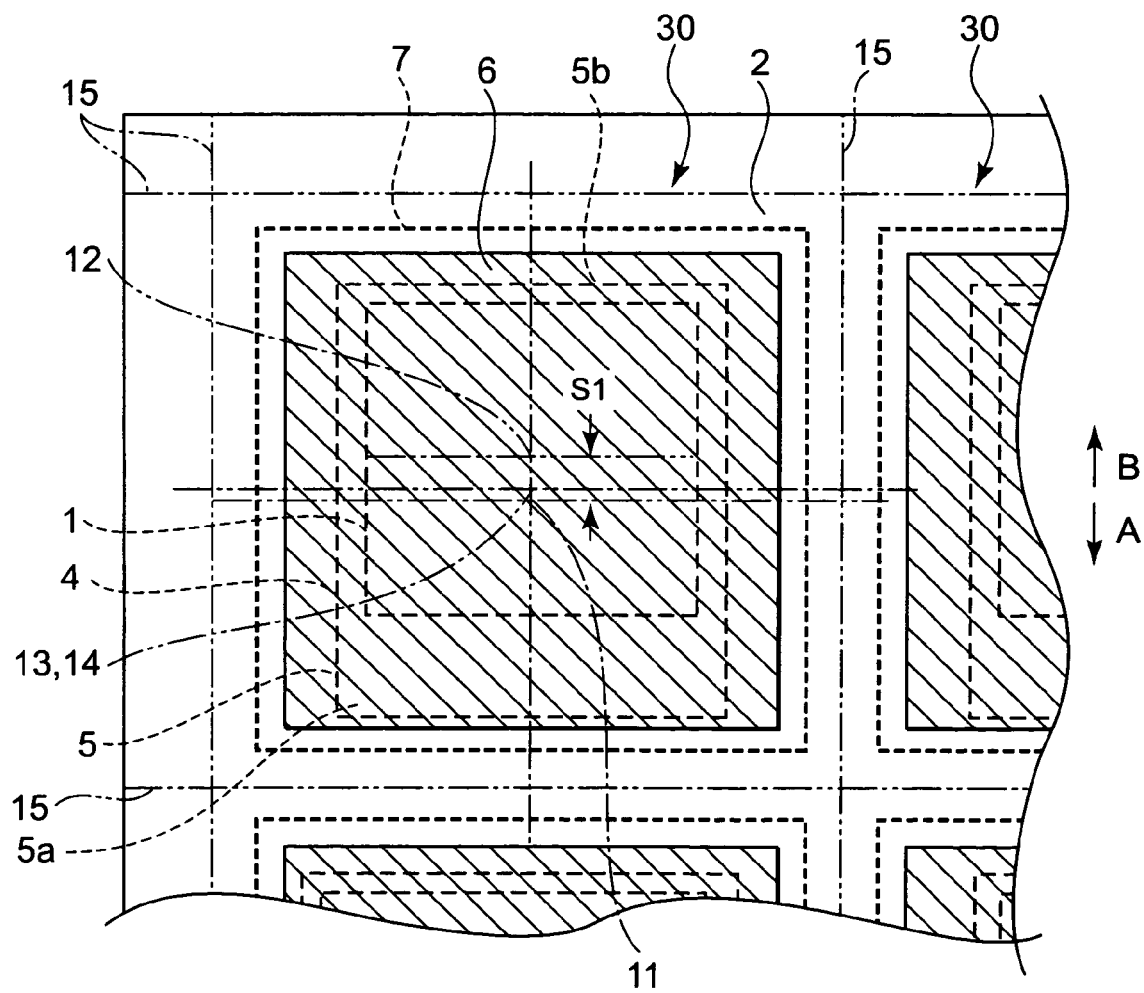
FIG. 12 is a plan view of the semiconductor device of the third embodiment.
Figure 13:
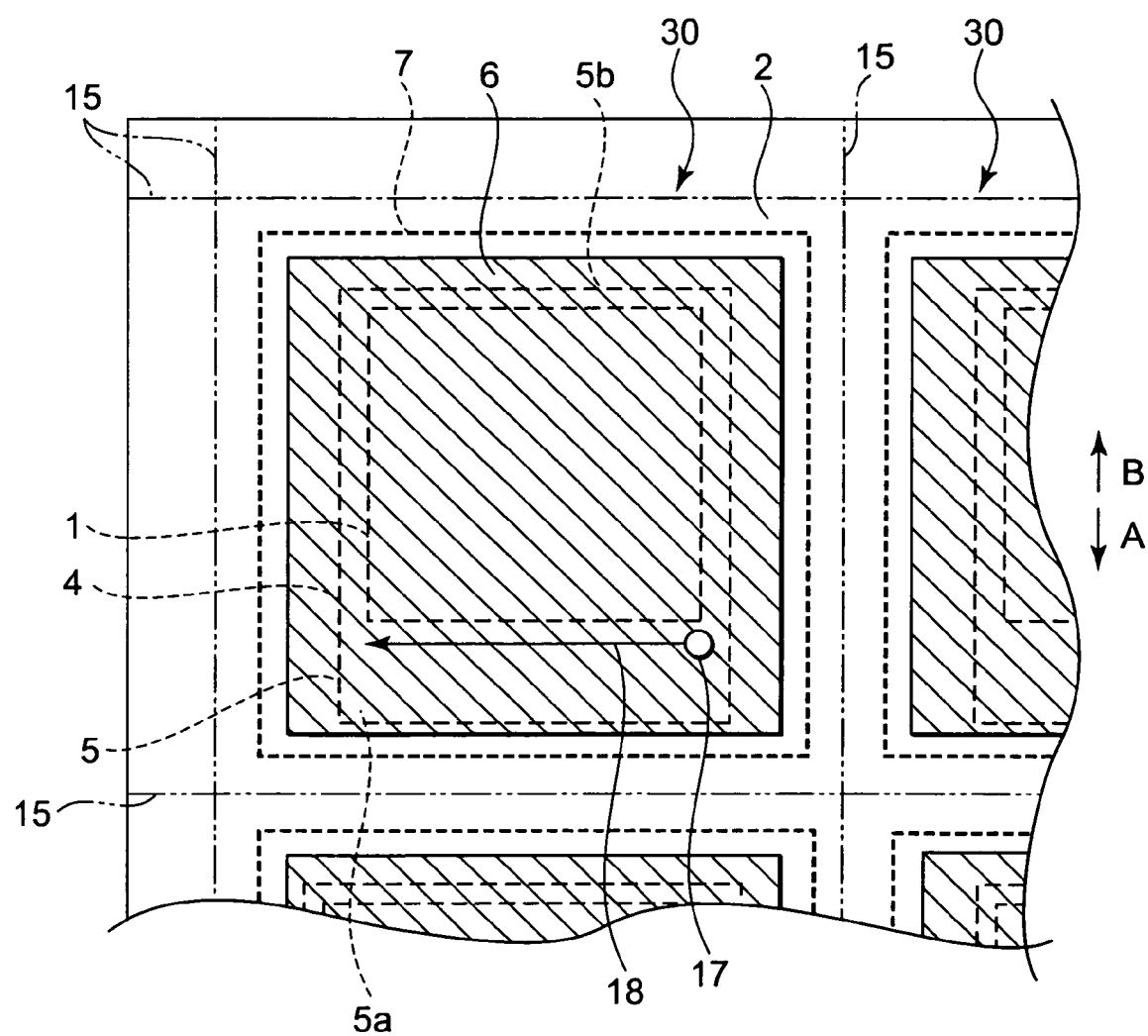
FIG. 13 is a plan view showing the action of an underfill resin injection nozzle during the formation of an underfill resin in the semiconductor device of the third embodiment.
Figure 14:
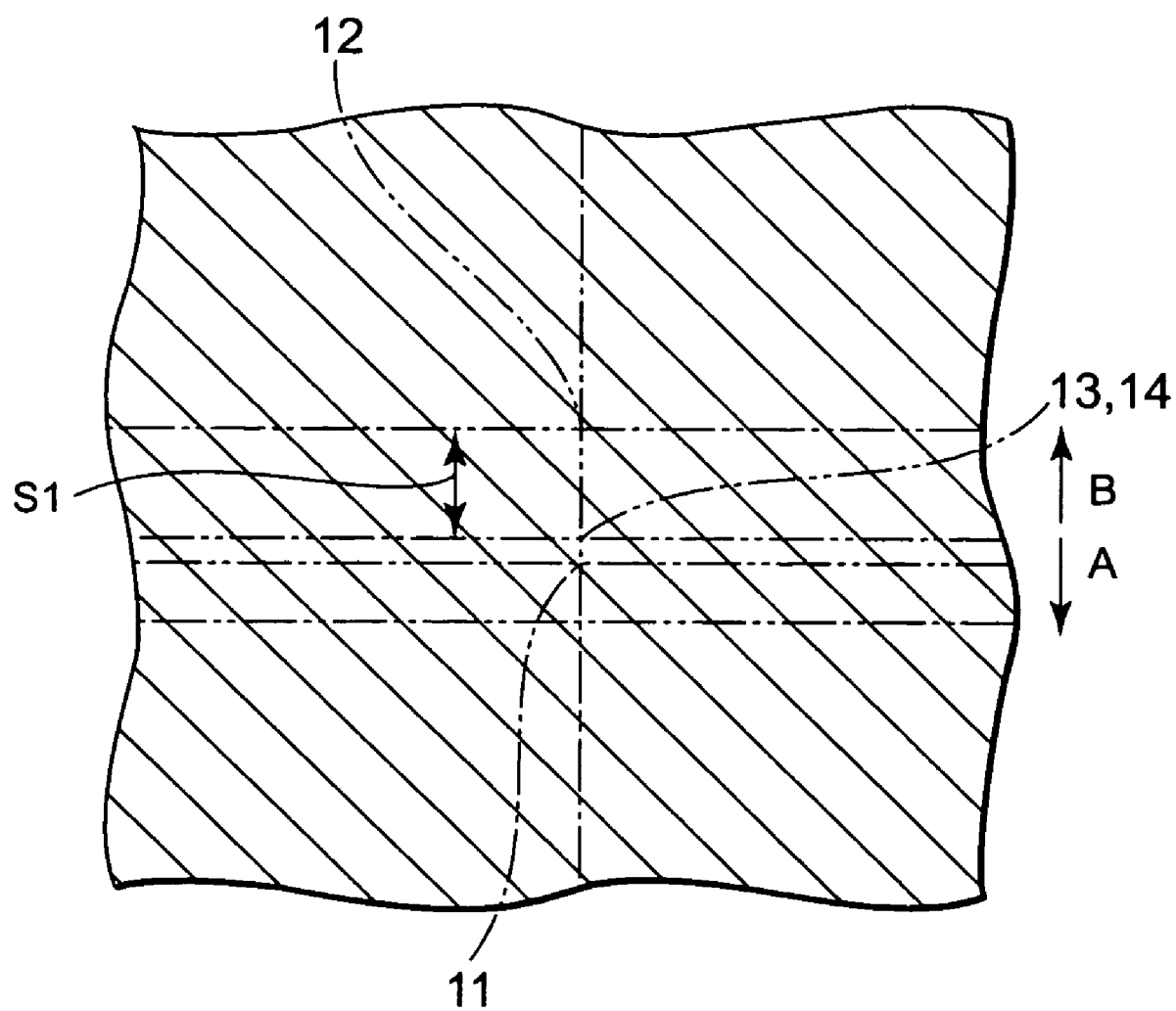
FIG. 14 is an enlarged view of an essential portion of FIG. 12.

FIG. 10 is a sectional view of a semiconductor device 30 of the third embodiment. FIG. 11 is an enlarged view of an essential portion of FIG. 10. FIGS. 12 and 13 are plan views of the semiconductor device 30 of the third embodiment. FIG. 13 shows the action (a movement line 18) of an underfill resin injection nozzle (not shown) during the formation of an underfill resin 4. FIG. 14 is an enlarged view of an essential portion of FIG. 12. Incidentally, FIGS. 12 and 13 show the condition before the singulation of each semiconductor device (package) 30.

As is apparent from FIGS. 10 to 14, the third embodiment differs from the first embodiment only in the point that the amount of deviation S2 of the center position 14 of a resin for encapsulation 6 from the center position 13 of a board 2 is 0. In other respects, the third embodiment is the same as in the first embodiment.

According to the third embodiment, the same effect as in the first embodiment is obtained.

Fourth Embodiment

Figure 15:
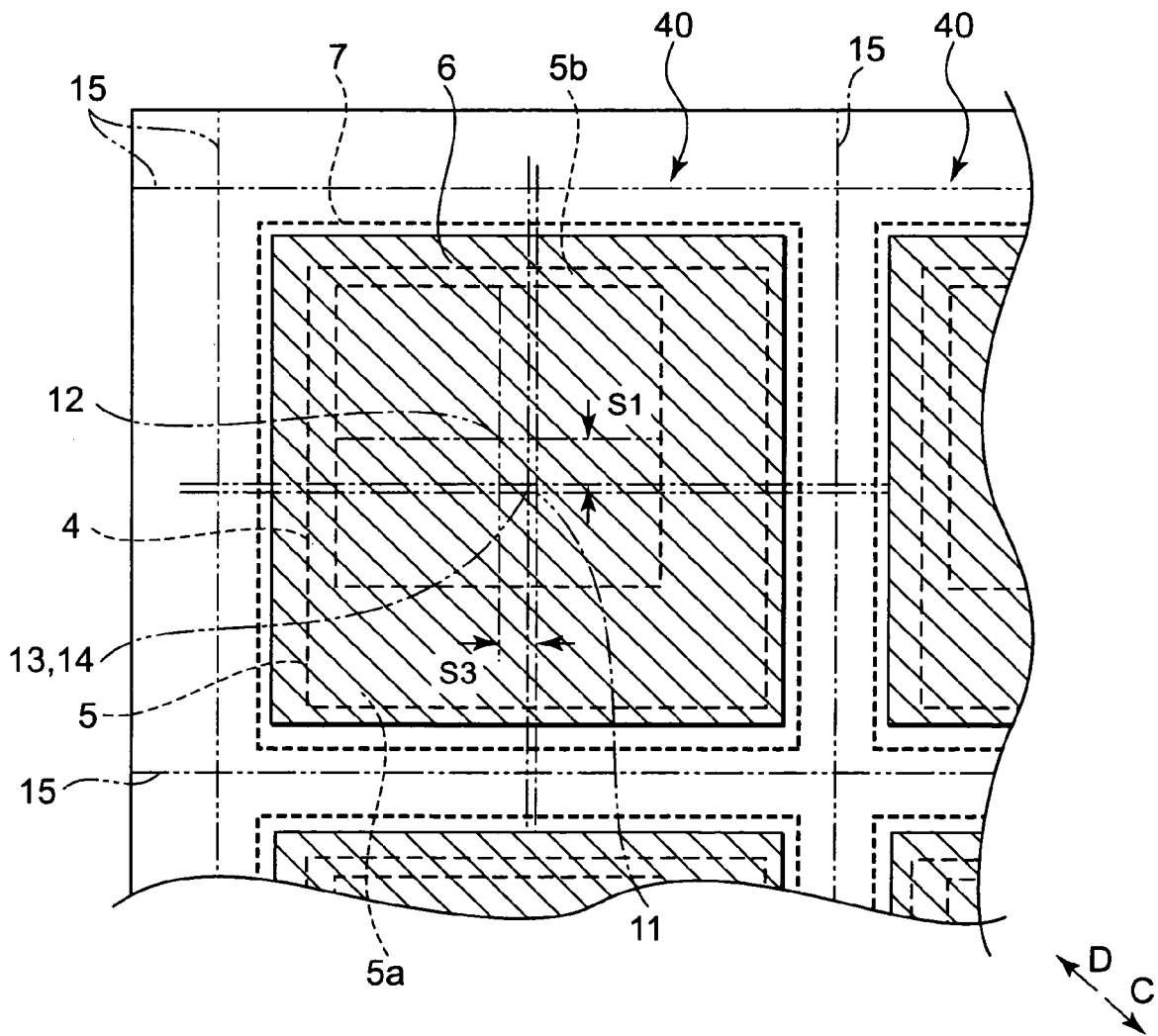
FIG. 15 is a plan view of the semiconductor device of the fourth embodiment.
Figure 16:
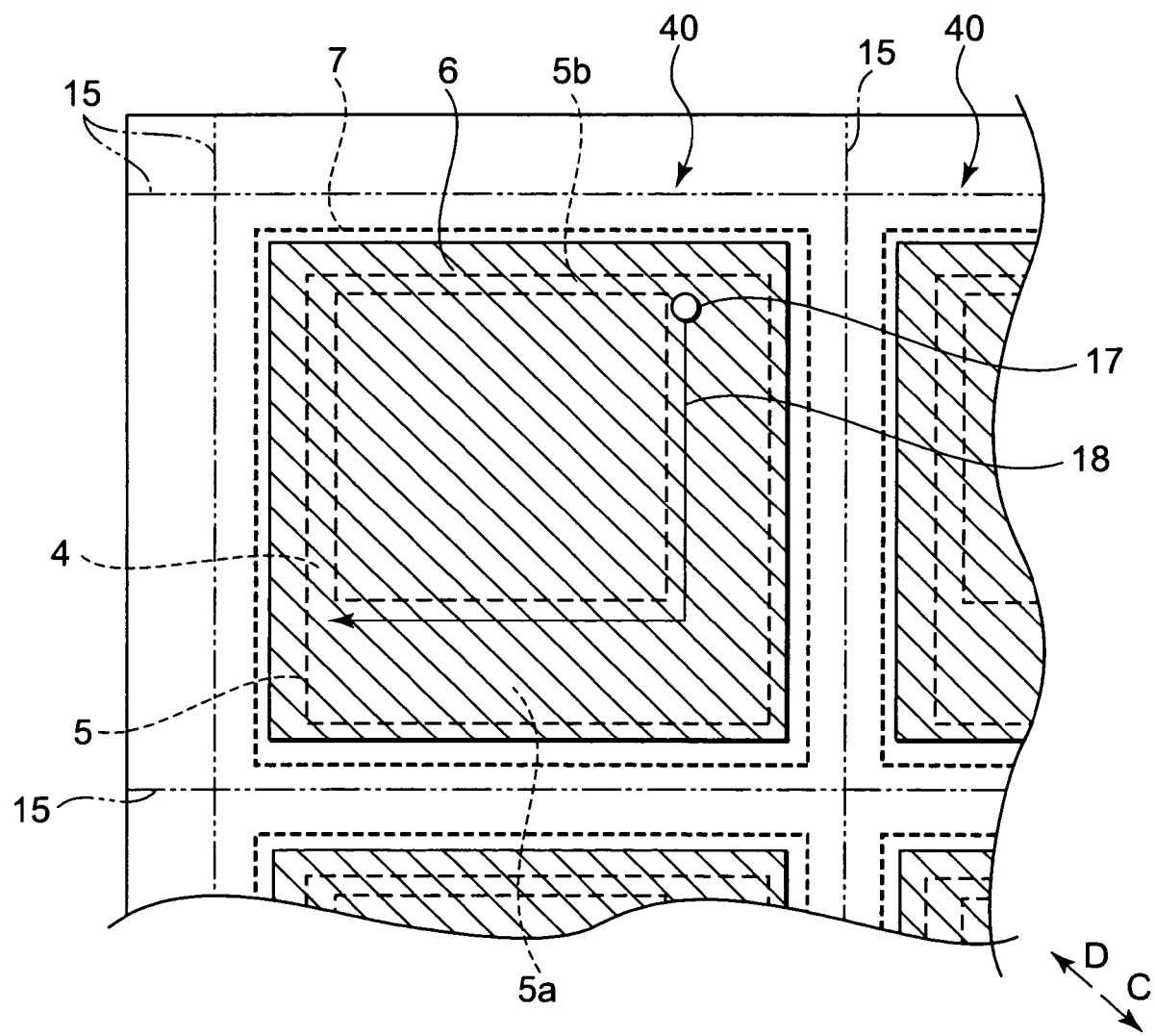
FIG. 16 is a plan view showing the action of an underfill resin injection nozzle during the formation of an underfill resin in the semiconductor device of the fourth embodiment.
Figure 17:
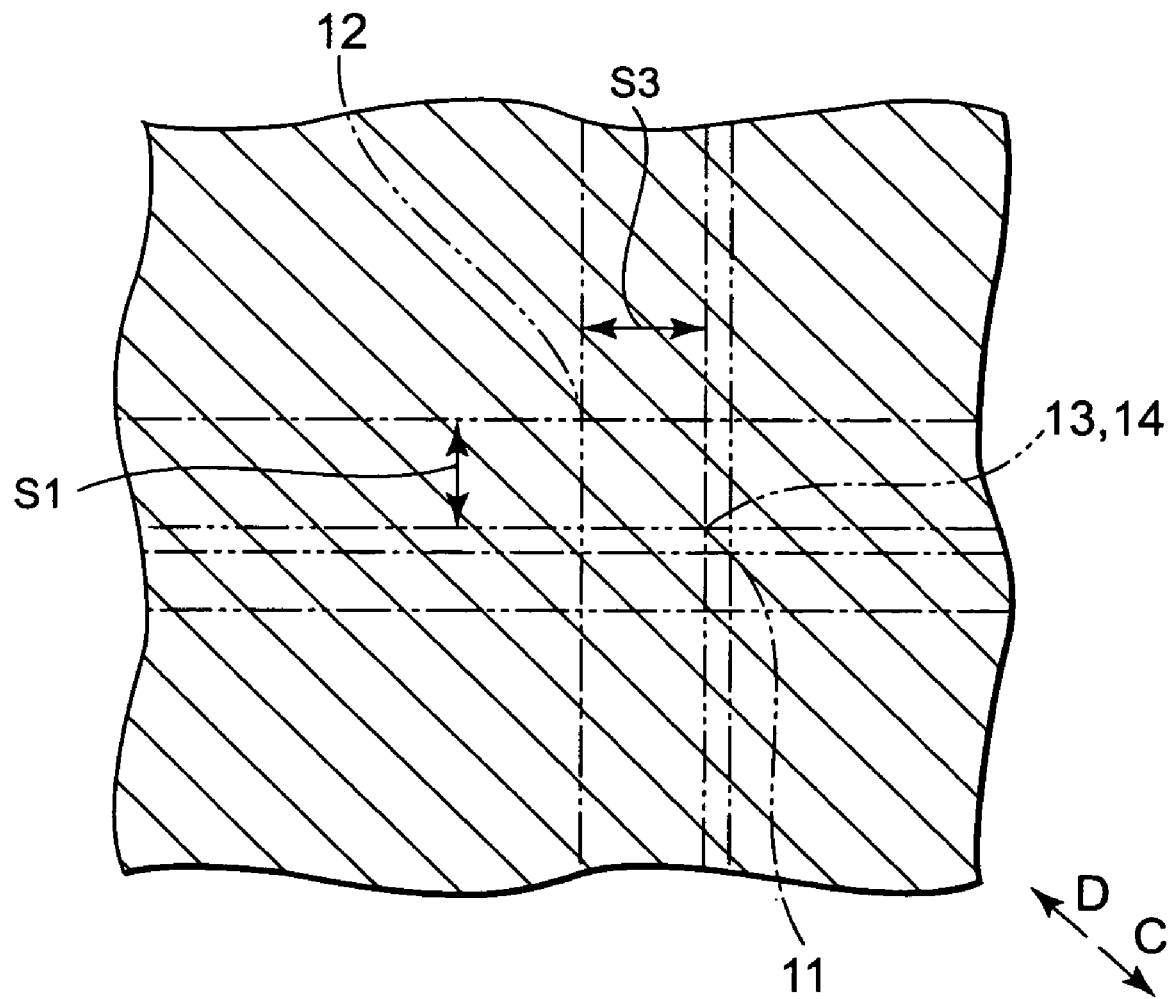
FIG. 17 is an enlarged view of an essential portion of FIG. 15.

FIGS. 15 and 16 are plan views of a semiconductor device 40 of the fourth embodiment. FIG. 16 shows the action (a movement line 18) of an underfill resin injection nozzle (not shown) during the formation of an underfill resin 4. FIG. 17 is an enlarged view of an essential portion of FIG. 15. Incidentally, FIGS. 15 and 16 show the condition before the singulation of each semiconductor device (package) 40. FIGS. 10 and 11, which were described in connection with the third embodiment, serve also as sectional views of the semiconductor device 40.

As is apparent from FIGS. 15 to 17, the fourth embodiment differs from the second embodiment only in the point that the amounts of deviation S2 and S4 of the center position 14 of a resin for encapsulation 6 from the center position 13 of a board 2 are 0. In other respects, the fourth embodiment is the same as in the second embodiment. According to the fourth embodiment, the same effect as in the second embodiment is obtained.

Fifth Embodiment

Figure 18:
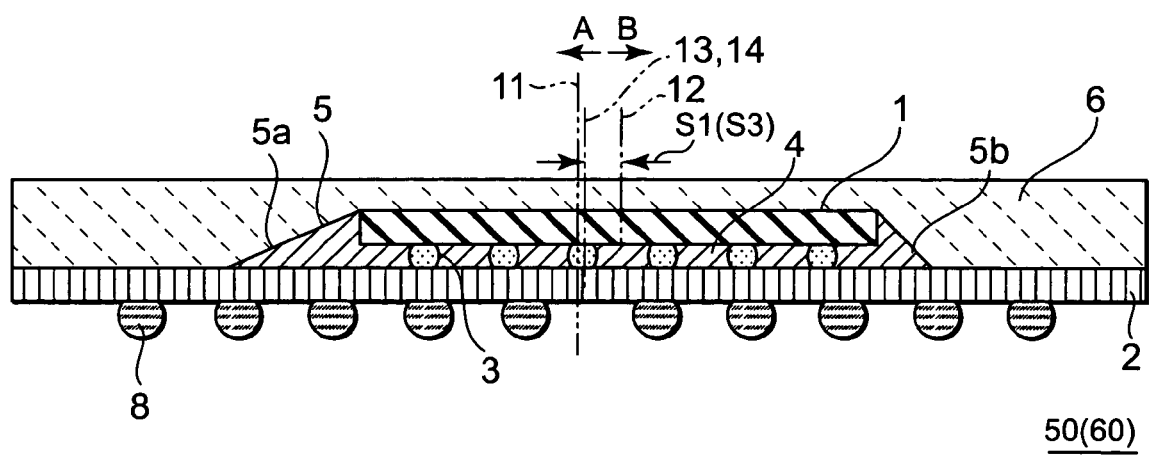
FIG. 18 is a sectional view common to semiconductor devices of the fifth and sixth embodiments.
Figure 19:
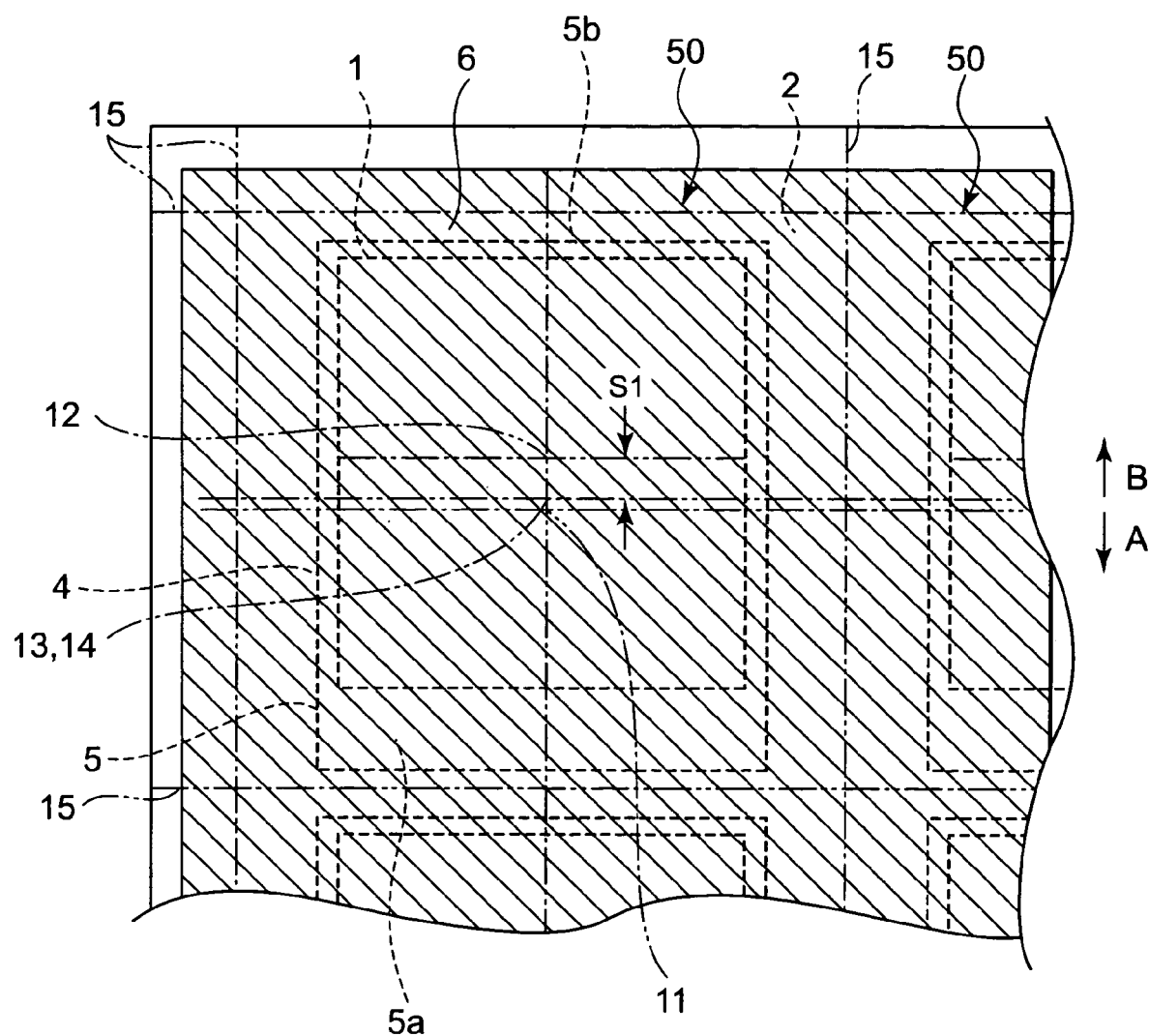
FIG. 19 is a plan view of the semiconductor device of the fifth embodiment.
Figure 20:
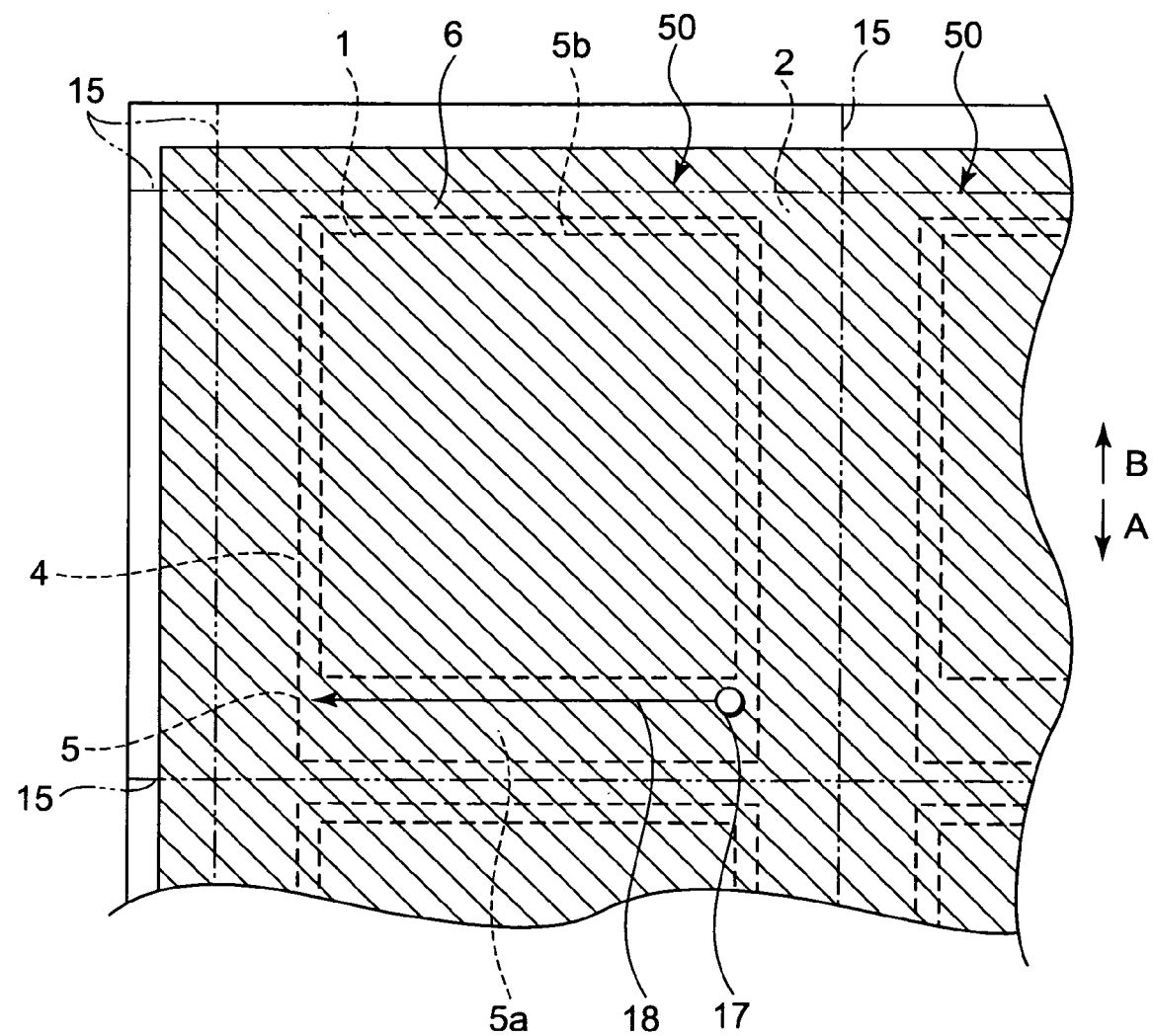
FIG. 20 is a plan view showing the action of an underfill resin injection nozzle during the formation of an underfill resin in the semiconductor device of the fifth embodiment.

FIG. 18 is a sectional view of a semiconductor device 50 of the fifth embodiment. FIGS. 19 and 20 are plan views of the semiconductor device 50 of the fifth embodiment. FIG. 20 shows the action (a movement line 18) of an underfill resin injection nozzle (not shown) during the formation of an underfill resin 4. Incidentally, FIGS. 19 and 20 show the condition before the singulation of each semiconductor device (package) 50. Because an enlarged view of an essential portion of FIG. 18 is the same as FIG. 11 and an enlarged view of an essential portion of FIG. 19 is the same as FIG. 14, these enlarged views are omitted.

As is apparent from FIGS. 18 to 20 and FIGS. 11 and 14, the fifth embodiment differs from the third embodiment in the point that the encapsulation with a resin for encapsulation 6 is performed collectively for a plurality of semiconductor devices 50. Furthermore, the fifth embodiment differs from the third embodiment in the point that the semiconductor device 50 is not provided with a PoP land 7. In other respects, the fifth embodiment is the same as the third embodiment.

In the case of this embodiment, the semiconductor device 50 is a collective encapsulation type which is produced by collectively encapsulating a plurality of semiconductor devices 50 with the resin for encapsulation 6. For this reason, as shown in FIGS. 18 to 20, the resin for encapsulation 6 covers the whole surface of a board 2 for the individual semiconductor devices 50. That is, the ratio of the area of the board 2 to the area of the resin for encapsulation 6 is substantially 1:1. For this reason, unlike the first embodiment, it is impossible to improve the symmetric characteristic of the semiconductor device 50 by causing the center position 14 of the resin for encapsulation 6 to deviate from the center position 13 of the board 2. However, it is possible to improve the symmetrical characteristic of the semiconductor device 50 by causing the center position 12 of the chip 1 from the center position 13 of the board 2 (making the amount of deviation S1 larger than 0). That is, according to the fifth embodiment, the same effect as in the third embodiment is obtained.

Sixth Embodiment

Figure 21:
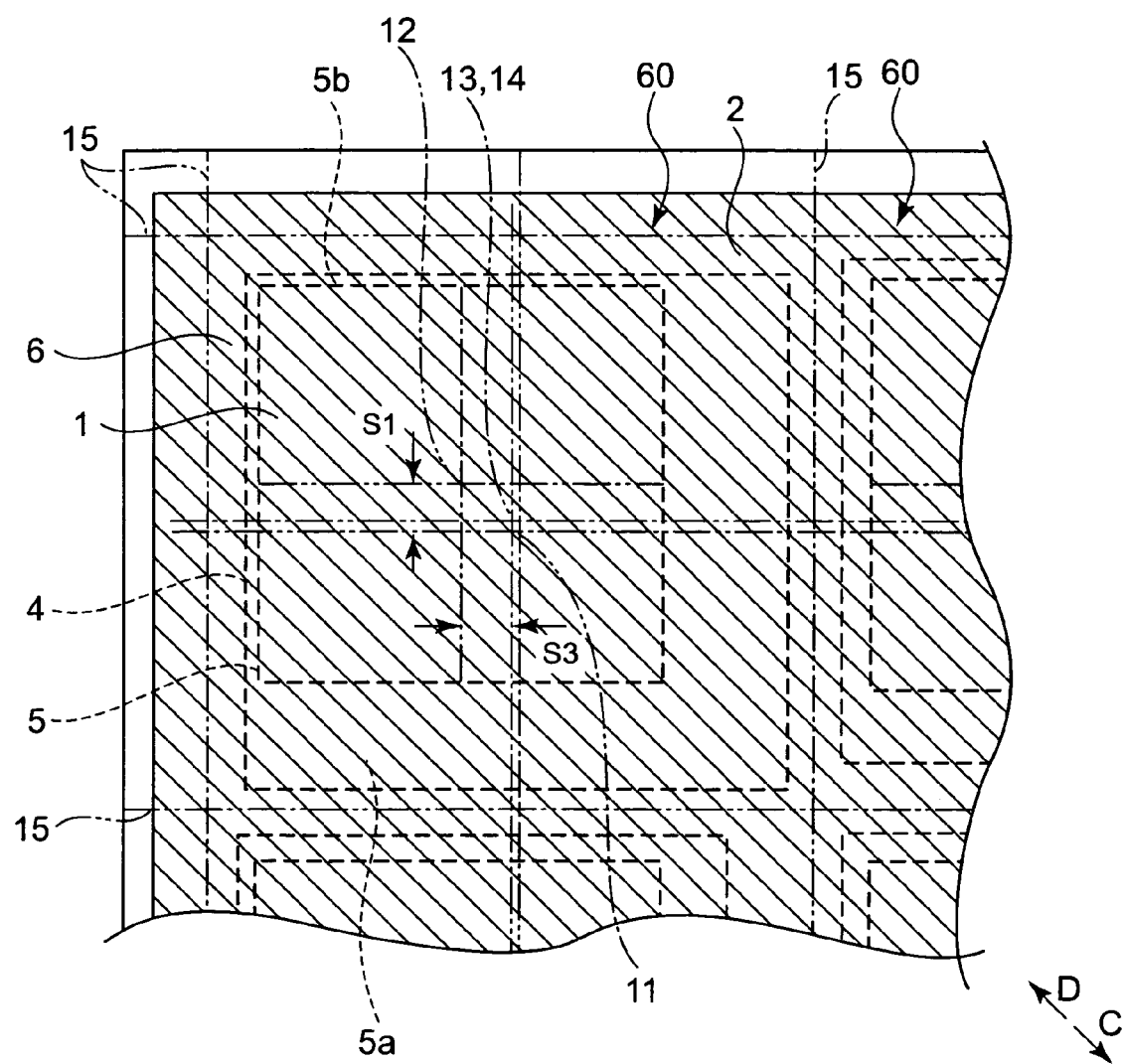
FIG. 21 is a plan view of the semiconductor device of the sixth embodiment.
Figure 22:
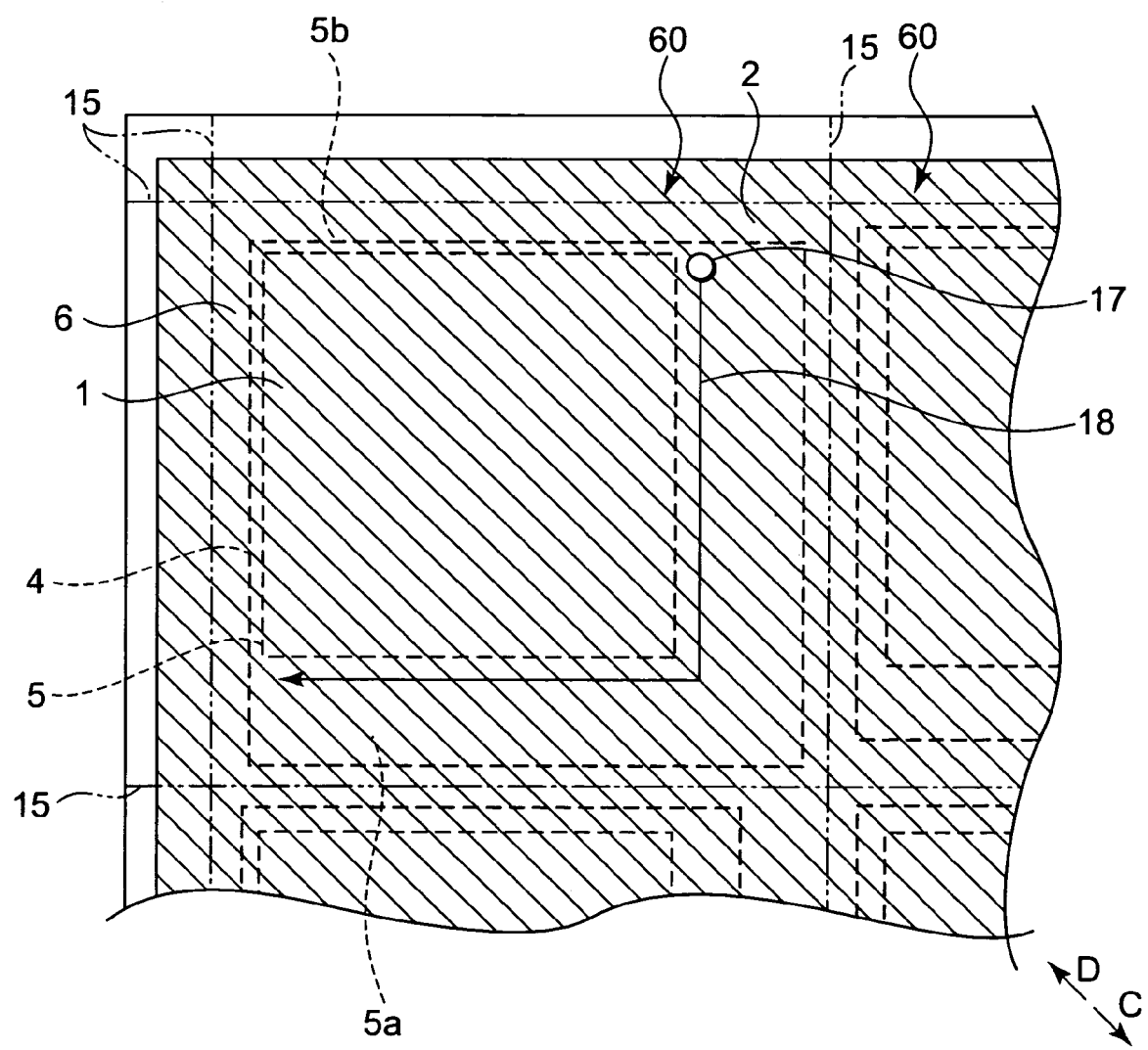
FIG. 22 is a plan view showing the action of an underfill resin injection nozzle during the formation of an underfill resin in the semiconductor device of the sixth embodiment.

FIGS. 21 and 22 are plan views of a semiconductor device 60 of the sixth embodiment. FIG. 22 shows the action (a movement line 18) of an underfill resin injection nozzle (not shown) during the formation of an underfill resin 4. Incidentally, FIGS. 21 and 22 show the condition before the singulation of each semiconductor device (package) 60. FIG. 18, which was described in connection with the fifth embodiment, serves also as a sectional view of the semiconductor device 60. Because an enlarged view of an essential portion of FIG. 21 is the same as FIG. 17 and an enlarged view of an essential portion of FIG. 18 in the case of this embodiment is the same as FIG. 11, these enlarged views are omitted.

The sixth embodiment differs from the above-described fourth embodiment in the point that the encapsulation with a resin for encapsulation 6 is performed collectively for a plurality of semiconductor devices 60. Furthermore, the sixth embodiment differs, from the above-described fourth embodiment in the point that the semiconductor device 60 is not provided with a PoP land 7. In other respects, the sixth embodiment is the same as the fourth embodiment.

In the case of this embodiment, because the semiconductor device 60 is a collective encapsulation type which is produced by collectively encapsulating a plurality of semiconductor devices 60 with the resin for encapsulation 6, as shown in FIG. 18, FIG. 21 and FIG. 22, the resin for encapsulation 6 covers the whole surface of a board 2 for the individual semiconductor devices 60. That is, the ratio of the area of the board 2 to the area of the resin for encapsulation 6 is substantially 1:1. For this reason, unlike the second embodiment, it is impossible to improve the symmetrical characteristic of the semiconductor device 60 by causing the center position 14 of the resin for encapsulation 6 to deviate from the center position 13 of the board 2. However, it is possible to improve the symmetrical characteristic of the semiconductor device 60 by causing the center position 12 of the chip 1 from the center position 13 of the board 2 (making the amounts of deviation S1 and S3 larger than 0). That is, according to the sixth embodiment, the same effect as in the fourth embodiment is obtained.

Seventh Embodiment

Figure 23:
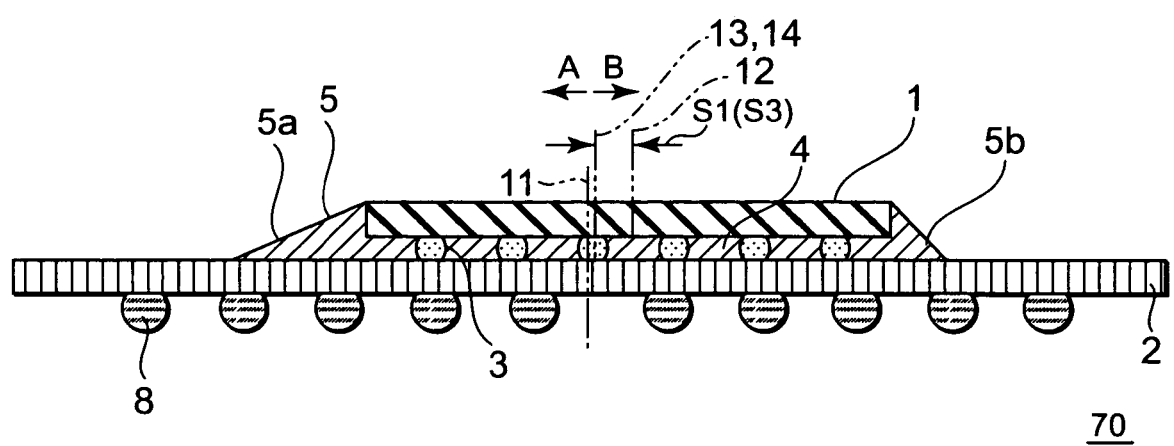
FIG. 23 is a sectional view of a semiconductor device of the seventh embodiment.
Figure 24:
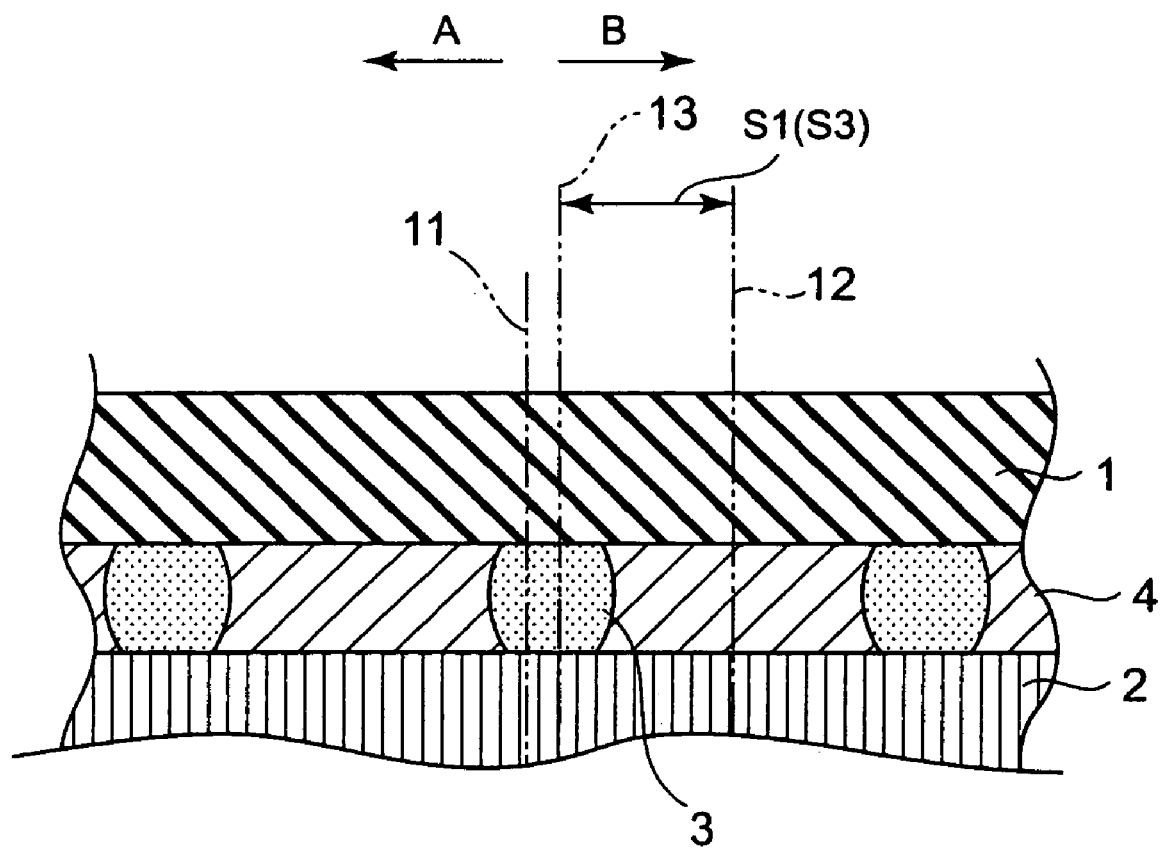
FIG. 24 is an enlarged view of an essential portion of FIG. 23.

FIG. 23 is a sectional view of a semiconductor device 70 of the seventh embodiment. FIG. 24 is an enlarged view of an essential portion of FIG. 23.

In each of the above-described embodiments, the descriptions were given of the resin-encapsulated FCBGAs. However, as shown in FIGS. 23 and 24, a semiconductor device 70 of this embodiment differs from the semiconductor device of the third or fourth embodiment only in the point that the semiconductor device 70 is not provided with the resin for encapsulation 6. In other respects, the semiconductor device 70 is the same as the semiconductor device of the third or fourth embodiment.

According to the seventh embodiment, in the semiconductor device 70 not provided with the resin for encapsulation 6, the same effect as in the above-described third or fourth embodiment is obtained.

Figure 27A:
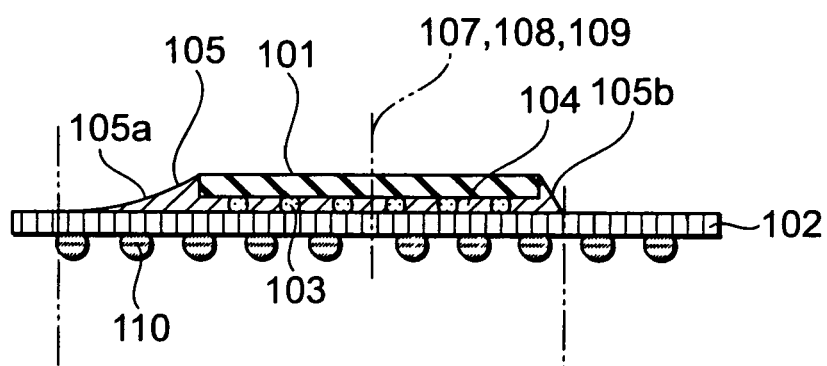
FIGS. 27A and 27B are a sectional view and a plan view, respectively, of the shape of a fillet obtained when an underfill resin was injected into a flip-chip mounted body from one point in the vicinity of a chip.
Figure 27B:
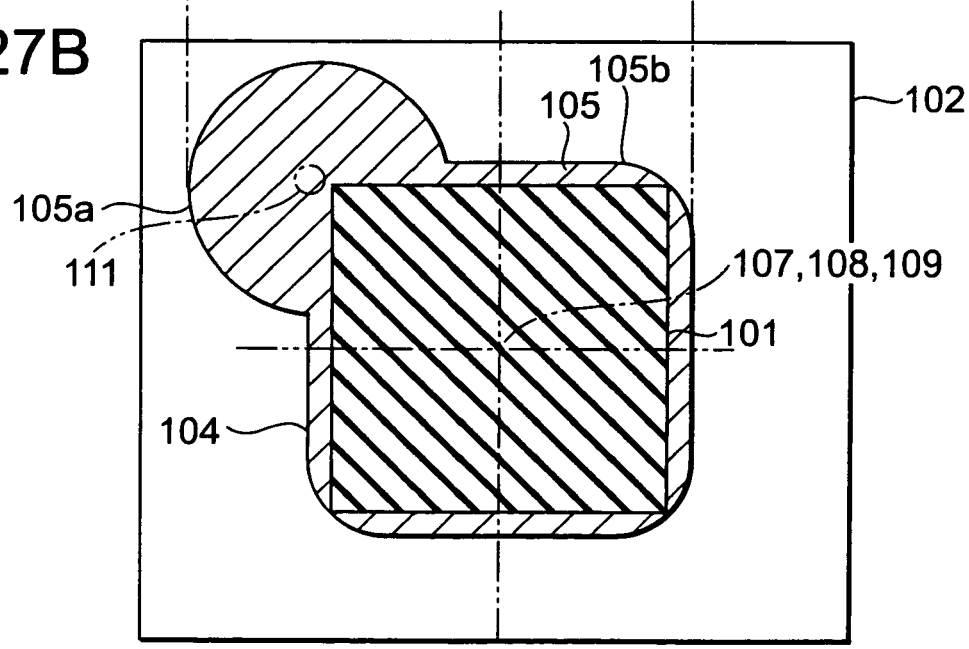
Figure 28A:
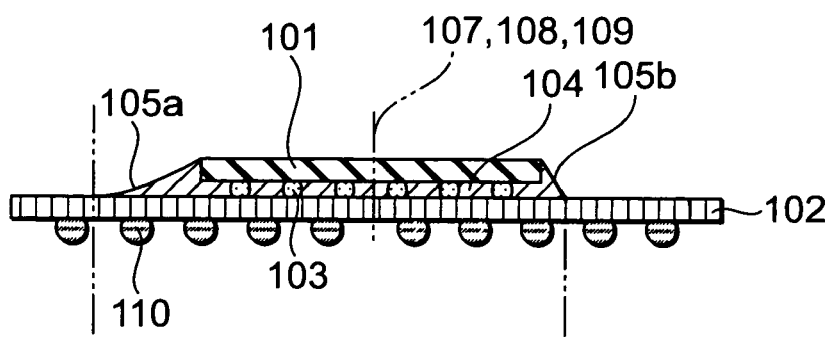
FIGS. 28A and 28B are a sectional view and a plan view, respectively, of the shape of a fillet obtained when an underfill resin was injected into a flip-chip mounted body along one side of a chip.
Figure 28B:
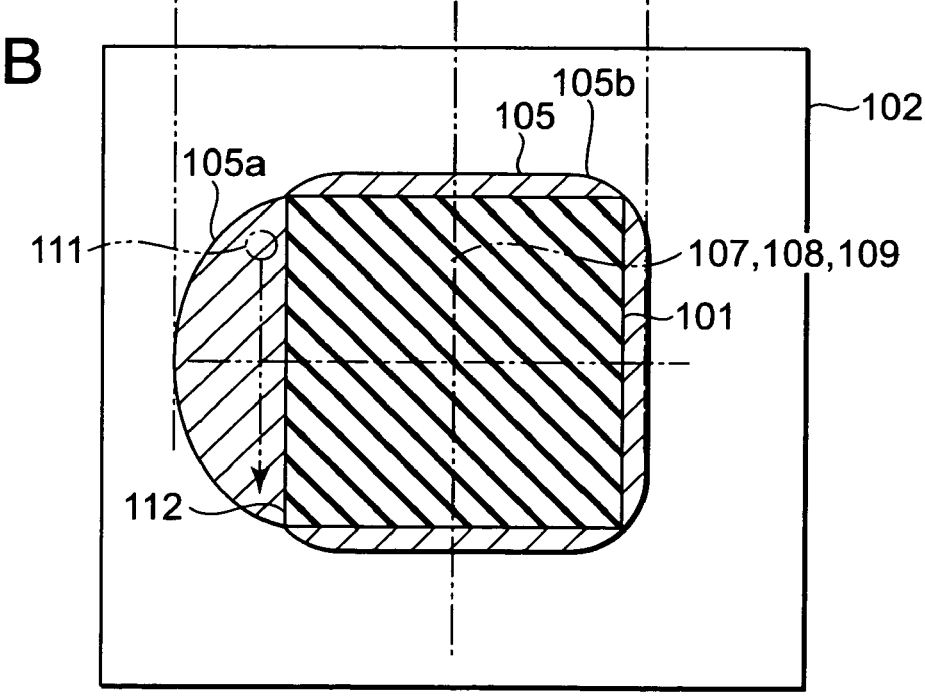
Figure 29A:
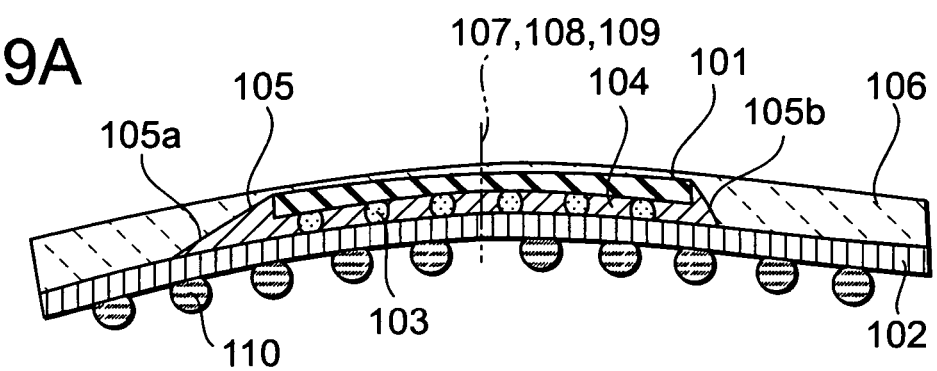
FIGS. 29A and 29B are diagrams showing bows of semiconductor devices.
Figure 29B:
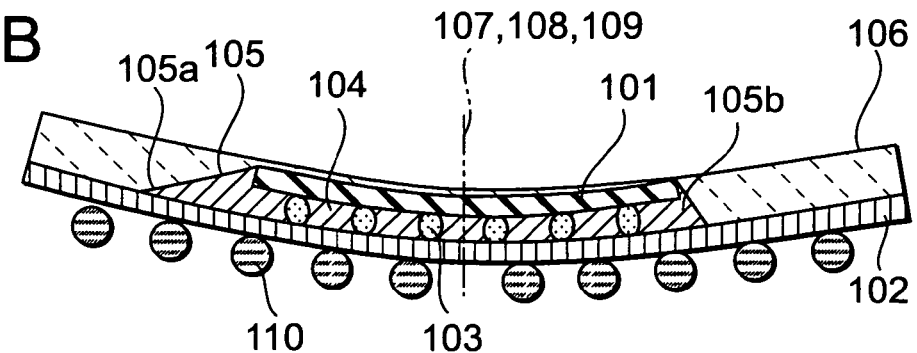

In each of the above-described embodiments, the descriptions were given of the case where the injection of the underfill resin 4 is performed while a needle or the like is being moved along one or two sides of the chip 1. However, it is needless to say that the embodiments are similarly applicable also to a case where, for example, as shown in FIG. 27, the underfill resin 4 is injected, with the needle or the like fixed at one point in the circumference of the chip 1, i.e., in a case where a large-sized portion 105*a* is formed with the center in the needle position 111.

What is claimed is:

1. A semiconductor device comprising:
   a wiring substrate;
   a semiconductor chip mounted on the wiring substrate in such a manner that one surface thereof is opposed to one surface of the wiring substrate; and
   a first resin which is filled in a gap between the surface of the wiring substrate and the surface of the semiconductor chip and part of which protrudes from the gap;
   wherein the center position of the first resin and the center position of the semiconductor chip deviate from each other in a direction along the surface of the wiring substrate, and
   wherein the center position of the semiconductor chip deviates from the center position of the wiring substrate in a direction reverse to the deviation direction of the center position of the first resin from the center position of the semiconductor chip.

2. The semiconductor device according to claim 1, further comprising:
   a second resin formed on the surface of the wiring substrate in such a manner as to cover the semiconductor chip and a portion protruding from the gap in the first resin,
   wherein the center position of the second resin deviates from the center position of the wiring substrate in the same direction as the deviation direction of the center position of the first resin from the center position of the semiconductor chip.

3. The semiconductor device according to claim 1, wherein the amount of deviation of the center position of the semiconductor chip from the center position of the wiring substrate is smaller than a maximum value of the width of a portion of the first resin protruding from the gap.

4. The semiconductor device according to claim 1, wherein the amount of deviation of the center position of the semiconductor chip from the center position of the wiring substrate is not less than $\frac{1}{100}$ of a maximum value of the width of a portion of the first resin protruding from the gap.

5. The semiconductor device according to claim 2, wherein the amount of deviation of the center position of the second resin from the center position of the wiring substrate is smaller than a maximum value of the width of a portion of the first resin protruding from the gap.

6. The semiconductor device according to claim 1, wherein the width of a portion of the first resin protruding from the gap is relatively large in a portion along one side of the semiconductor chip in the first resin and is relatively small in portions along other sides.

7. The semiconductor device according to claim 1, wherein the width of a portion of the first resin protruding from the gap is relatively large in a portion along two sides of the semiconductor chip which are adjacent to each other in the first resin and is relatively small in portions along the other sides.

8. The semiconductor device according to claim 2, wherein the coefficient of thermal expansion of the second resin is larger than the coefficient of thermal expansion of the first resin.

9. A semiconductor device comprising:
   a wiring substrate;
   a semiconductor chip mounted on the wiring substrate in such a manner that one surface thereof is opposed to one surface of the wiring substrate;
   a first resin which is filled in a gap between the surface of the wiring substrate and the surface of the semiconductor chip and part of which protrudes from the gap; and a second resin formed on the surface of the wiring substrate in such a manner as to cover the semiconductor chip and a portion protruding from the gap in the first resin, wherein the center position of the first resin and the center position of the semiconductor chip deviate from each other in a direction along the surface of the wiring substrate, and wherein the center position of the second resin deviates from the center position of the wiring substrate in the same direction as the deviation direction of the center position of the first resin from the center position of the semiconductor chip.

10. The semiconductor device according to claim 9, wherein the amount of deviation of the center position of the second resin from the center position of the wiring substrate is smaller than a maximum value of the width of a portion of the first resin protruding from the gap.

11. The semiconductor device according to claim 9, wherein the width of a portion of the first resin protruding from the gap is relatively large in a portion'along one side of the semiconductor chip in the first resin and is relatively small in portions along other sides.

12. The semiconductor device according to claim 9, wherein the width of a portion of the first resin protruding from the gap is relatively large in a portion along two sides of the semiconductor chip which are adjacent to each other in the first resin and is relatively small in portions along other sides.

13. The semiconductor device according to claim 9, wherein the coefficient of thermal expansion of the second resin is larger than the coefficient of thermal expansion of the first resin.

14. The semiconductor device according to claim 9, wherein the glass transition temperature of the second resin is lower than the glass transition temperature of the first resin.

* * * * *